(12) United States Patent
Kim et al.

(10) Patent No.: US 11,210,208 B2
(45) Date of Patent: Dec. 28, 2021

(54) MEMORY SYSTEM INCLUDING MEMORY MODULE, MEMORY MODULE, AND OPERATING METHOD OF MEMORY MODULE

(71) Applicant: Samsung Electronics Co., Ltd., Suwon-si (KR)

(72) Inventors: Dae-Jeong Kim, Seoul (KR); Jiseok Kang, Hwaseong-si (KR); Tae-Kyeong Ko, Hwaseong-si (KR); Sung-Joon Kim, Hwaseong-si (KR); Wooseop Kim, Seoul (KR); Chanik Park, Seongnam-si (KR); Wonjae Shin, Seoul (KR); Yongjun Yu, Suwon-si (KR); Insu Choi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 111 days.

(21) Appl. No.: 16/162,821

(22) Filed: Oct. 17, 2018

(65) Prior Publication Data

US 2019/0303282 A1 Oct. 3, 2019

(30) Foreign Application Priority Data

Mar. 27, 2018 (KR) .................. 10-2018-0035270

(51) Int. Cl.
*G06F 12/02* (2006.01)
*G11C 11/56* (2006.01)
*G06F 3/06* (2006.01)
*G06F 13/16* (2006.01)

(52) U.S. Cl.
CPC ........ *G06F 12/0238* (2013.01); *G06F 3/0679* (2013.01); *G06F 13/1668* (2013.01); *G11C 11/5628* (2013.01)

(58) Field of Classification Search
CPC .................................................... G06F 3/0659
See application file for complete search history.

(56) References Cited

U.S. PATENT DOCUMENTS

| | | | |
|---|---|---|---|
| 6,085,248 A * | 7/2000 | Sambamurthy | H04L 29/06 709/223 |
| 6,633,936 B1 * | 10/2003 | Keller | G06F 13/161 710/107 |
| 9,836,404 B2 | 12/2017 | Ummadi et al. | |

(Continued)

FOREIGN PATENT DOCUMENTS

KR 1020170096277 8/2017

*Primary Examiner* — Edward J Dudek, Jr.
*Assistant Examiner* — Ralph A Verderamo, III
(74) *Attorney, Agent, or Firm* — Myers Bigel, P.A.

(57) ABSTRACT

A memory system includes a nonvolatile memory module and a first controller configured to control the nonvolatile memory module. The nonvolatile memory module includes a volatile memory device, a nonvolatile memory device, and a second controller configured to control the volatile memory device and the nonvolatile memory device. The first controller may be configured to transmit a read request to the second controller. When, during a read operation according to the read request, normal data is not received from the nonvolatile memory device, the first controller may perform one or more retransmits of the read request to the second controller without a limitation on a number of times that the first controller performs the one or more retransmits of the read request.

19 Claims, 23 Drawing Sheets

(56) References Cited

U.S. PATENT DOCUMENTS

| | | |
|---|---|---|
| 2005/0141535 A1 | 6/2005 | Kuo et al. |
| 2007/0101067 A1* | 5/2007 | Shafi ................. G06F 12/0897 711/141 |
| 2007/0186040 A1* | 8/2007 | Kasahara ............. G06F 11/073 711/115 |
| 2007/0271495 A1 | 11/2007 | Shaeffer et al. |
| 2010/0293337 A1 | 11/2010 | Murphy et al. |
| 2012/0230122 A1* | 9/2012 | Chandra ............... G11C 11/419 365/189.04 |
| 2013/0036261 A1* | 2/2013 | Kim ................... G06F 11/1048 711/103 |
| 2013/0080858 A1* | 3/2013 | Lee ....................... G11C 16/26 714/773 |
| 2014/0056068 A1* | 2/2014 | Strasser ............. G06F 11/1048 365/185.03 |
| 2014/0237205 A1* | 8/2014 | Takefman ............... G06F 21/71 711/162 |
| 2015/0186278 A1 | 7/2015 | Jayakumar et al. |
| 2016/0103613 A1 | 4/2016 | Oshins et al. |
| 2016/0321010 A1* | 11/2016 | Hashimoto ........... G06F 3/0643 |
| 2016/0357665 A1 | 12/2016 | Lee et al. |
| 2016/0371187 A1 | 12/2016 | Roberts |
| 2017/0062065 A1* | 3/2017 | Shim ...................... G11C 16/20 |
| 2017/0153826 A1 | 6/2017 | Cho et al. |
| 2017/0235524 A1 | 8/2017 | Yoo et al. |
| 2017/0249266 A1 | 8/2017 | Nale et al. |
| 2017/0286305 A1 | 10/2017 | Kalwitz |
| 2018/0018095 A1 | 1/2018 | Lee et al. |
| 2018/0068734 A1* | 3/2018 | Zhou ................... G06F 11/1068 |
| 2018/0077236 A1* | 3/2018 | Niikura .................. G06F 3/061 |
| 2018/0217758 A1* | 8/2018 | Wang ..................... G11C 16/10 |
| 2019/0088314 A1* | 3/2019 | Sato ..................... G11C 11/5642 |
| 2019/0179750 A1 | 6/2019 | Moyer et al. |
| 2020/0050362 A1 | 2/2020 | Lee et al. |

* cited by examiner

MEMORY SYSTEM INCLUDING MEMORY MODULE, MEMORY MODULE, AND OPERATING METHOD OF MEMORY MODULE

CROSS-REFERENCE TO RELATED APPLICATIONS

This application claims priority under 35 U.S.C. § 119 to Korean Patent Application No. 10-2018-0035270 filed Mar. 27, 2018, in the Korean Intellectual Property Office, the disclosure of which is incorporated by reference herein in its entirety.

BACKGROUND

Embodiments of the inventive concept relate to a semiconductor memory, and more particularly, to a memory system including a memory module, the memory module, and a method of operating the memory module.

A semiconductor memory uses semiconductor devices to store data. The semiconductor memory includes a volatile memory such as a dynamic random access memory or a static random access memory and a nonvolatile memory such as a flash memory, a phase change memory, a ferroelectric memory, a magnetic memory, a resistive memory, etc.

Typically, the volatile memory supports high-speed random access, and is used as a main memory of a computing system such as a personal computer, a server, or a workstation. The nonvolatile memory supports a large storage capacity, and is used as an auxiliary storage of the computing system.

In recent years, a storage class memory (SCM) has been researched and developed. The storage class memory is being developed to support the large storage capacity of the nonvolatile memory and the high-speed random access of the volatile memory. The storage class memory is implemented using the nonvolatile memory.

For compatibility with existing main memory, the storage class memory is being researched and developed based on the same memory module as the dynamic random access memory. However, due to a difference between an operating characteristic of the dynamic random access memory, which is the main memory, and an operating characteristic of the nonvolatile memory, there may be a problem in implementing the storage class memory.

SUMMARY

Embodiments of the inventive concept provide a memory system including a memory module capable of overcoming a difference between operating characteristics and normally performing a reading and a writing, the memory module, and a method of operating the memory module.

According to some embodiments, a memory system may include a nonvolatile memory module and a first controller configured to control the nonvolatile memory module. The nonvolatile memory module may include a volatile memory device, a nonvolatile memory device, and a second controller configured to control the volatile memory device and the nonvolatile memory device. The first controller may be configured to transmit a read request to the second controller. When, during a read operation according to the read request, normal data is not received from the nonvolatile memory device, the first controller performs one or more retransmits of the read request to the second controller without a limitation on a number of times that the first controller performs the one or more retransmits of the read request.

According to some embodiments, a memory module may include a volatile memory device, a nonvolatile memory device, and a controller configured to control the volatile memory device and the nonvolatile memory device. During a write operation, the controller performs a writing to one of the volatile memory device or the nonvolatile memory device in response to a write request. While the writing to the nonvolatile memory device is performed, the controller activates a write error signal output to an external device.

According to some embodiments, a method of operating a memory module configured to communicate with a controller may include detecting a power on and updating a value of a register of the controller through a system management bus (SMBus) to perform a read retry without a limitation to a number of times the read retry is performed.

According to embodiments of the inventive concept, when the reading or the writing to the nonvolatile memory device is performed, read retries or write retries are allowed without the limitation on the number of times the read retries or the write retries are performed. Therefore, embodiments of the inventive concept provides the memory module capable of preventing a read fail or a write fail that occur due to a read speed or a write speed of the nonvolatile memory slower than a read speed or a write speed of the dynamic random access memory, the memory system including the memory module, and the operating method of the memory module.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Below, embodiments of the inventive concept will be described clearly and in detail with reference to accompanying drawings to such an extent that an ordinary one in the art implements embodiments of the invention.

Figure 1:
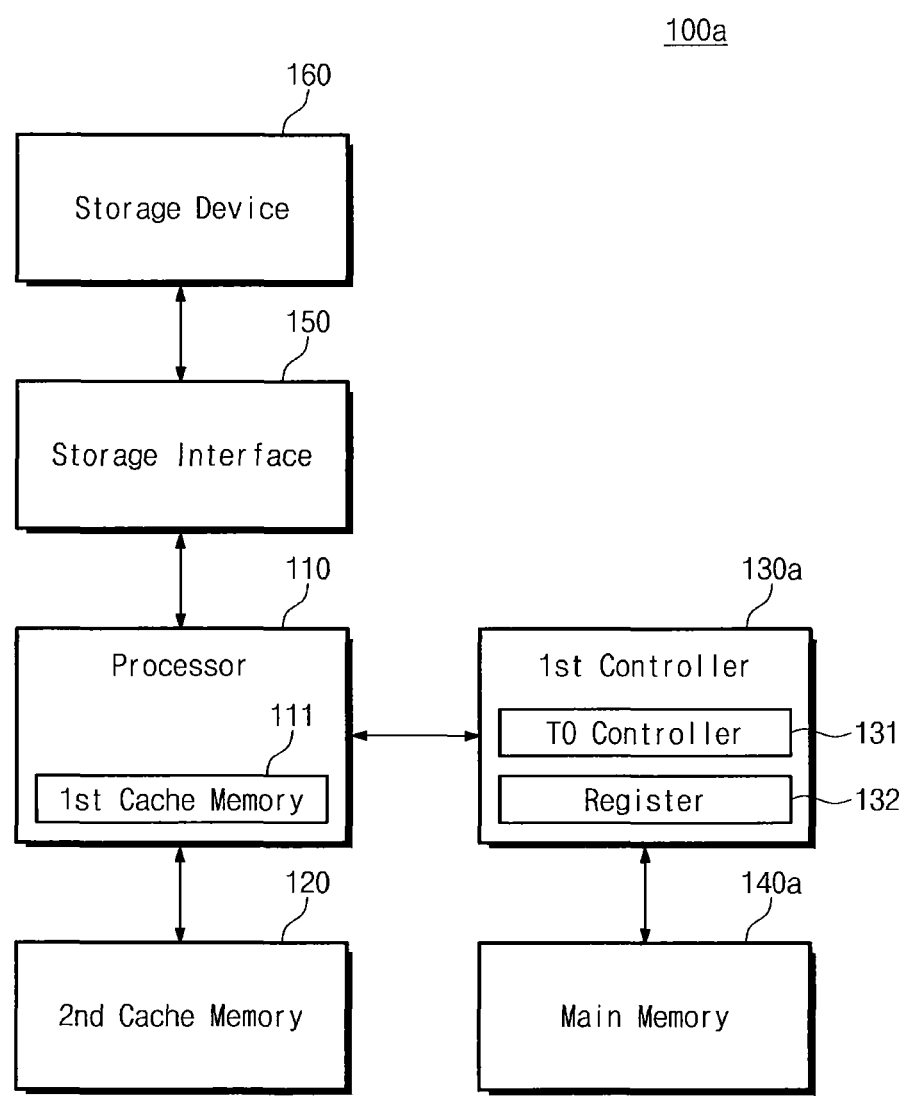
FIG. 1 is a block diagram illustrating a computing device according to some embodiments of the present inventive concept.

FIG. 1 is a block diagram illustrating a computing device 100a according to some embodiments of the inventive concept. For example, the computing device 100a may include servers such as an application server, a client server, and a data server. In some embodiments, the computing device 100a may include a personal computer or a workstation.

Referring to FIG. 1, the computing device 100a may include a processor 110, a second cache memory 120, a first controller 130a, a main memory 140a, a storage interface 150, and a storage device 160. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

The processor 110 may control components of the computing device 100a and operations of the components. The processor 110 may execute an operating system and applications, and process data using the operating system and the applications. The processor 110 may include a first cache memory 111. The first cache memory 111 may include a high-speed memory such as a static random access memory (SRAM).

The second cache memory 120 may communicate with the processor 111. The second cache memory 120 may include a high-speed random access memory such as a static random access memory (SRAM) and a dynamic random access memory (DRAM).

The first controller 130a may access the main memory 140a in response to a request of the processor 110. For example, the first controller 130a may be based on one of standards of memory modules such as a dual in-line memory module (DIMM), a registered DIMM (RDIMM), a load reduced DIMM (LRDIMM), etc. In some embodiments, the first controller 130a may be disposed outside the processor 110 as shown in FIG. 1 or may be included in the processor 110.

The first controller 130a may include a time-out controller 131 and a register 132. The time-out controller 131 may measure a time when the first controller 130a accesses the main memory 140a. The register 132 may store various parameters associated with the first controller 130a.

For example, the register 132 may store various time-out values associated with when the first controller 130a accesses the main memory 140a. The time-out controller 131 may control a time-out when the first controller 130a accesses the main memory 140a based on the time-out values stored in the register 132.

The main memory 140a may include a storage class memory (SCM) that has a nonvolatile storage capability or a large capacity and has an access speed and a random access capability similar to a dynamic random access memory (DRAM).

To support compatibility with existing computing devices, the main memory 140a may be implemented based on one of the standards of the memory modules such as DIMM, RDIMM, LRDIMM, etc. The first controller 130a and the main memory 140a may form a memory system.

The storage interface 150 may receive a request of the processor 110 or transmit data to the storage device 160. The storage interface 150 may transmit data received from the storage device 160 to the processor 110. The storage interface 150 may be based on one of various standards such as a peripheral component interconnect express (PCIe), a nonvolatile memory express (NVMe), a serial advanced technology attachment (SATA), etc.

The storage device 160 may store data received from the storage interface 150 in response to a request received from the storage interface 150. The storage device 160 may transmit the stored data through the storage interface 150 in response to a request received from the storage interface 150.

The storage device 160 may include a nonvolatile storage medium and a controller to control the nonvolatile storage medium. The storage device 160 may include a hard disk drive (HDD), a solid state drive (SDD), etc.

The processor 110 may process data hierarchically. For example, a source data of the operating system, a source data of the application, and a user data, which are used in the computing device 100a, may be stored in the storage device 160. The user data may include data generated by a user of the operating system, the application, or the computing device 100a.

When a particular data (e.g., the source data and/or the user data) needed by the processor 110 is stored in the storage device 160, the processor 110 may read the particular data from the storage device 160 and may store the particular data to the main memory 140a. The processor 110 may backup the particular data stored in the main memory 140a to the storage device 160 when the particular data is updated or modified.

Some of the storage areas of the main memory 140a may be mapped to the second cache memory 120. Some of storage areas of the second cache memory 120 may be mapped to the first cache memory 111. In some embodiments, at least one of the first and second cache memories 111 and 120 in the computing device 100a may be omitted.

Figure 2:
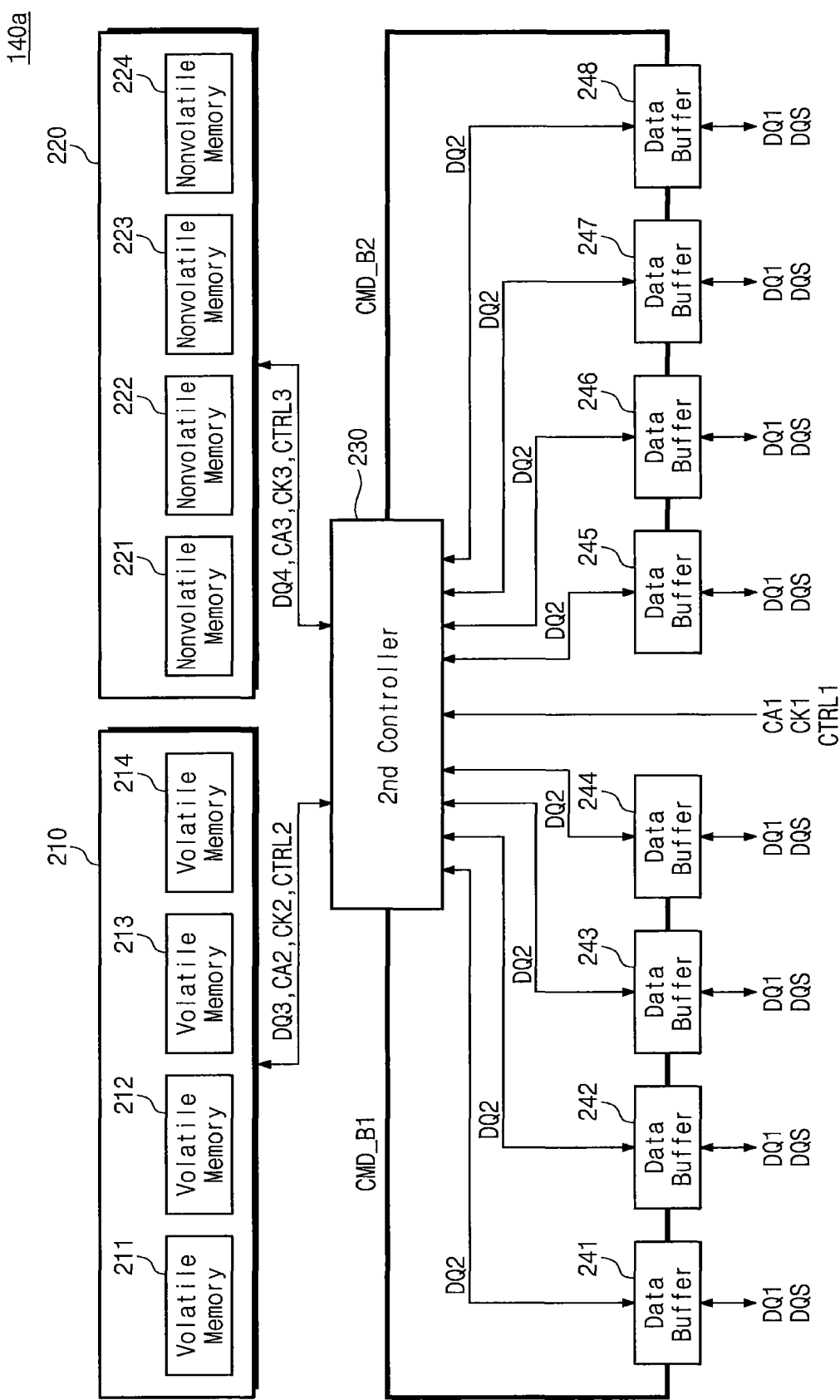
FIG. 2 is a block diagram illustrating a main memory according to some embodiments of the present inventive concept.

FIG. 2 is a block diagram illustrating the main memory 140a according to some embodiments of the inventive concept. In some embodiments, the main memory 140a may be a memory module based on the LRDIMM standard. Referring to FIG. 2, the main memory 140a may include a volatile memory device 210, a nonvolatile memory device 220, a second controller 230, and first to eighth data buffers 241 to 248.

The volatile memory device 210 may include first to fourth volatile memories 211 to 214. The first to fourth volatile memories 211 to 214 may be formed as packages divided from each other. The first to fourth volatile memories 211 to 214 may include the dynamic random access memories.

The nonvolatile memory device 220 may include first to fourth nonvolatile memories 221 to 224. The first to fourth nonvolatile memories 221 to 224 may be formed as packages divided from each other that are physically and/or logically separate from one another. The first to fourth nonvolatile memories 221 to 224 may be storage areas that are identified by different addresses in the nonvolatile memory device 220.

The nonvolatile memory device 220 may include at least one of various nonvolatile memory devices such as a flash memory device, a phase change memory device, a ferroelectric memory device, a resistive memory device, a magnetic memory device, etc.

The second controller 230 may receive a first command and address CA1, a first clock signal CK1, and a first control signal CTRL1 from the first controller 130a. The second controller 230 may communicate with the first to eighth data buffers 241 and 248 to receive and transmit second data signals DQ2. The second controller 230 may access the volatile memory device 210 or the nonvolatile memory device 220 according to the first command and address CA1, the first clock signal CK1, and the first control signal CTRL1.

The second controller 230 may transmit a second command and address CA2, a second clock signal CK2, and a second control signal CTRL2 to the volatile memory device 210, and may communicate with the volatile memory device 210 to receive and transmit third data signals DQ3. The second controller 230 may transmit a third command and address CA3, a third clock signal CK3, and a third control signal CTRL3 to the nonvolatile memory device 220, and may communicate with the nonvolatile memory device 220 to receive and transmit fourth data signals DQ4.

In some embodiments, the first command and address CA1, the second command and address CA2, and the third command and address CA3 may have different formats from each other. In some embodiments, at least two of the first command and address CA1, the second command and address CA2, and the third command and address CA3 may have the same formats. For example, a format that the second controller 230 communicates with the volatile memory device 210 may be different from a format that the second controller 230 communicates with the nonvolatile memory device 220.

The second controller 230 may transmit a first buffer command CMD_B1 to control the first to fourth data buffers 241 to 244. The second controller 230 may transmit a second buffer command CMD_B2 to control the fifth to eighth data buffers 245 to 248.

The first to eighth data buffers 241 to 248 may communicate with the first controller 130a in synchronization with data strobe signals DQS to transmit and receive first data signals DQ1. The first to eighth data buffers 241 to 248 may transmit the first data signals DQ1, which are received from the first controller 130a, as the second data signals DQ2 to the second controller 230.

The first to eighth data buffers 241 to 248 may transmit the second data signals DQ2, which are received from the second controller 230, as the first data signals DQ1 to the first controller 130a. The first to eighth data buffers 241 to 248 may be formed as packages divided from each other.

In some embodiments, the volatile memory device 210 may be used as a cache memory of the nonvolatile memory device 220. Some of a storage space of the nonvolatile memory device 220 may be mapped to the volatile memory device 210.

When a first storage space indicated by the first command and address CA1 received from the first controller 130a is mapped to the volatile memory device 210, that is, when a cache hit occurs, the second controller 230 may transmit the second command and address CA2 to the volatile memory device 210. The volatile memory device 210 may perform a writing operation and a reading operation according to the second command and address CA2.

When the first storage space indicated by the first command and address CA1 received from the first controller 130a is not mapped to the volatile memory device 210, that is, when a cache miss occurs, the second controller 230 may map the first storage space indicated by the first command and address CA1 to the volatile memory device 210.

For example, a second storage space associated with a first storage space of the nonvolatile memory device 220 may be secured in the volatile memory device 210. When a storage space of the volatile memory device 210 is insufficient, the second controller 230 may discard the other storage space mapped to the volatile memory device 210 or return another storage space to the nonvolatile memory device 220 to secure the storage space of the volatile memory device 210.

When data is stored in the first storage space of the nonvolatile memory device 220, the second controller 230 may copy the data stored in the first storage space to a second storage space of the volatile memory device 210. And then, the second controller 230 may transmit the second command and address CA2 to the volatile memory device 210. The volatile memory device 210 may perform the writing operation and the reading operation to the second storage space in response to the second command and address CA2.

To release the second storage space in the volatile memory device 210, the second controller 230 may check whether the second storage space is dirty, i.e. previously used. For example, when the writing to the second storage space is performed, the second storage space may be determined to be dirty.

When the second storage space is not dirty, the second controller 230 may discard the data of the second storage space to release the second storage space. When the second storage space is dirty, the second controller 230 may write the data of the second storage space to the nonvolatile memory device 220 to return the second storage space. After returning the second storage space, the second controller 230 may discard the second storage space to release the second storage space.

In some embodiments, the volatile memory device 210 and the nonvolatile memory device 220 may be directly accessed by the first controller 130a. For example, when the first command and address CA1 or the first control signal CTRL1 indicates the volatile memory device 210, the second controller 230 may transmit the second command and address CA2, the second clock signal CK2, and/or the second control signal CTRL2 to the volatile memory device 210.

When the first command and address CA1 or the first control signal CTRL1 indicates the nonvolatile memory device 220, the second controller 230 may transmit the third command and address CA3, the third clock signal CK3, and/or the third control signal CTRL3 to the nonvolatile memory device 220.

In some embodiments, the number of volatile memories, nonvolatile memories, and data buffers is not limited thereto. The number of the volatile memories or the nonvolatile memories may be equal to the number of the data buffers. The number of the data buffers may be changed to nine or increased/decreased as needed.

Figure 3:
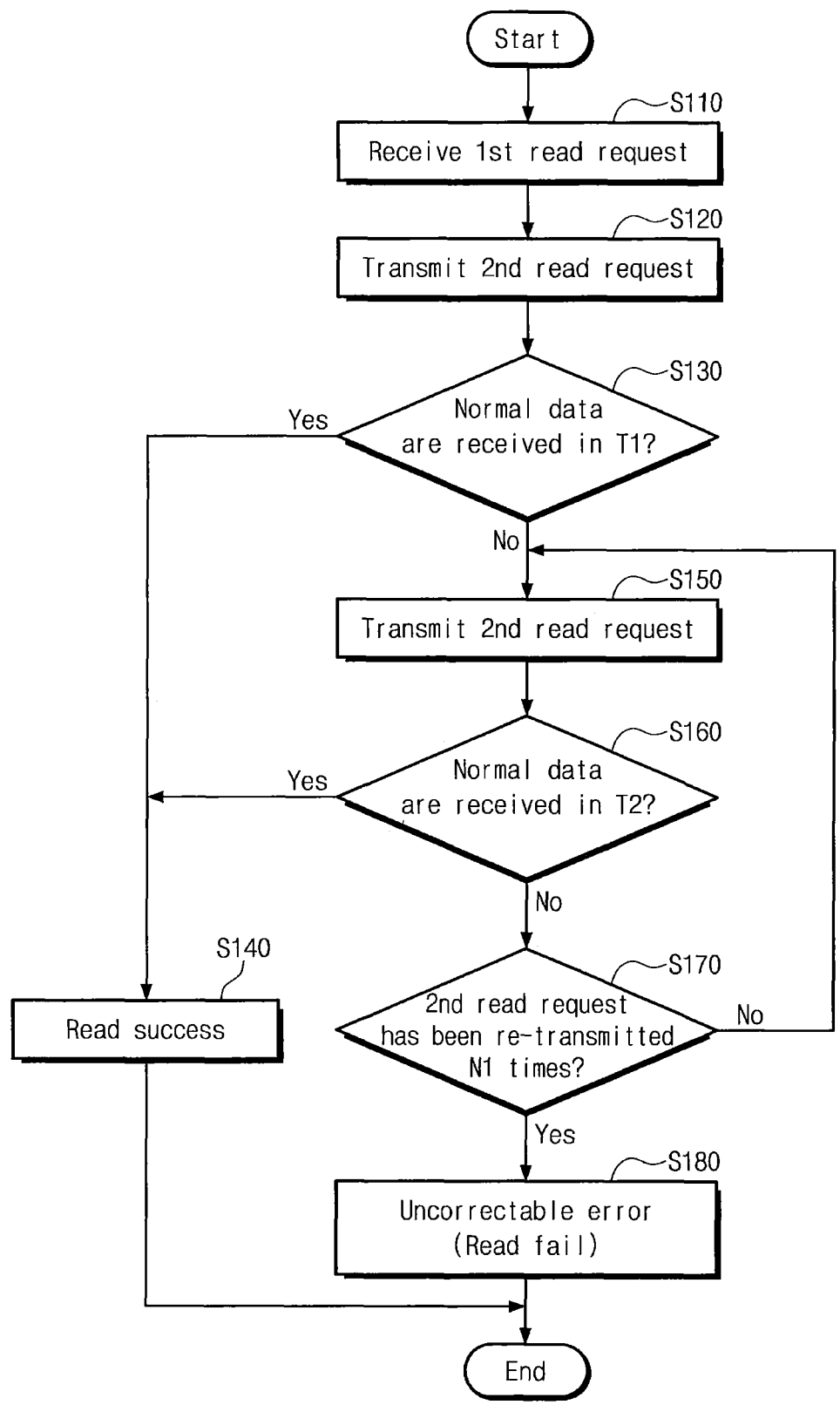
FIG. 3 is a flowchart for describing a read operation of the first controller 130a for the main memory 140a according to some embodiments of the present inventive concept.

FIG. 3 is a flowchart for describing a read operation of the first controller 130a for the main memory 140a. Referring to FIGS. 1 to 3, in operation S110, the first controller 130a may receive a first read request. For example, the first controller 130a may receive the first read request from the processor 110.

In operation S120, the first controller 130a may transmit a second read request to the second controller 230. For example, the first controller 130a may generate the second read request using the first read request. A format of the first read request may be the same as or different from a format of the second read request. One or more the second read requests may be generated from one first read request.

In operation S130, the first controller 130a may determine whether a normal data is received within a first time T1. For example, the normal data may include an error-free data or correctable data having an error within a correctable range. The correctable range may be determined according to a type of an error correction code used to communicate between the first controller 130a and the second controller 230.

Unlike the normal data, data having an error or data having an error outside the correctable range may be an error data. When the normal data is received within the first time T1, in operation S140, a read success may be determined. The first controller 130a may transmit the received normal data to the processor 110.

When the normal data is not received within the first time T1 or the error data is received within the first time T1, in operation S150, the first controller 130a may retransmit the second read request to the second controller 230. For example, the second read request transmitted in operation S150 may be the same as the second read request transmitted in operation S120. Operation S150 may be referred to as a read retry.

In operation S160, the first controller 130a may determine whether the normal data is received within a second time T2. The second time T2 may be equal to or different from the first time T1. When the normal data is received within the second time T2, in operation S140, the read success may be determined.

When the normal data is not received within the second time T2, operation S170 may be performed. In operation S170, the first controller 130a may determine whether the second read request is retransmitted at least the number of times (N1 times) of a first value N1. For example, the first controller 130a may determine whether the read retry is performed by the number of times of a first value N1.

When the read retry is not performed by the number of times of the first value N1, in operation S150, the read retry may be performed. When the read retry is performed by the number of times of the first value N1, operation S180 may be performed. In operation S180, when an uncorrectable error occurs, the first controller 130a may determine a read fail. This prevents the read requests of the first controller 130a from becoming stuck in an endless loop.

Figure 4:
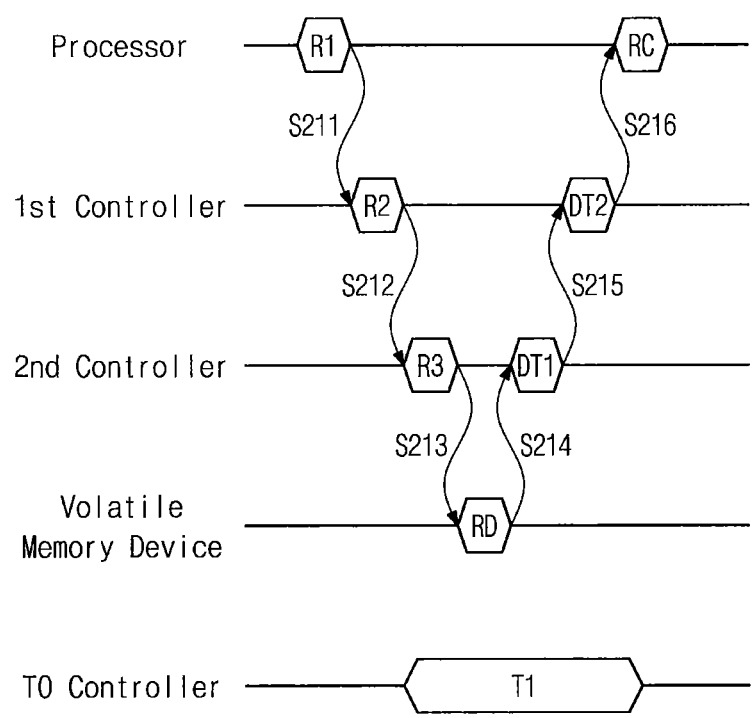
FIG. 4 is a timing diagram of an example read operation according to the operating method illustrated in FIG. 3 according to some embodiments of the present inventive concept.

FIG. 4 is an example for describing a read operation according to the operating method illustrated in FIG. 3. For example, the first command and address CA1 may be associated with the volatile memory device 210, and a read operation performed in the volatile memory device 210 is illustrated in FIG. 4.

Referring to FIG. 1 to FIG. 4, the processor 110 may generate a first read request R1. In operation S211, the processor 110 may transmit the first read request R1 to the first controller 130a. The first controller 130a may generate a second read request R2 according to the first read request R1.

In operation S212, the first controller 130a may transmit the second read request R2 to the second controller 230. The second read request R2 may be transmitted to the second controller 230 as the first command and address CA1. According to transmitting the second read request R2, the time-out controller 131 may begin measuring (or counting) for the first time T1 (operation S130 shown in FIG. 3). In other words, a timer associated with first time T1 may be started after transmitting the second read request R2 by the first controller 130a and/or upon receipt of the second read request R2 by the second controller 230.

The second controller 230 may generate a third read request R3 according to the second read request R2. In operation S213, the second controller 230 may transmit the third read request R3 to the volatile memory device 210. The third read request R3 may be transmitted to the volatile memory device 210 as the second command and address CA2.

For example, the second controller 230 may not process the second read request R2 and may transmit the unprocessed second read request R2 to the volatile memory device 210 as the third read request R3. In some embodiments, the second controller 230 may process the second read request R2 into a form appropriate to the volatile memory device 210, and may transmit the processed second read request R2 to the volatile memory device 210 as the third read request R3.

The volatile memory device 210 may perform a read operation RD in response to the third read request R3. Data read from the volatile memory device 210 may be transmitted to the second controller 230. In operation S214, the read operation RD may be completed.

The second controller 230 may perform a first data transmission DT1 to transmit the data read from the volatile memory device 210 to the first controller 130a. In operation S215, the first data transmission DT1 may be completed, and the data may be transmitted to the first controller 130a.

The first controller 130a may receive data from the main memory 140a before the first time T1 passes after transmitting the second read request R2. For example, the received data may be the normal data. Therefore, the first controller 130a may determine the read success.

The first controller 130a may perform a second data transmission DT2 to transmit data received from the second controller 230 to the processor 110. In operation S216, the second data transmission DT2 may be completed, and the data may be transmitted to the processor 110. The processor 110 may determine a read completion RC.

Figure 5:
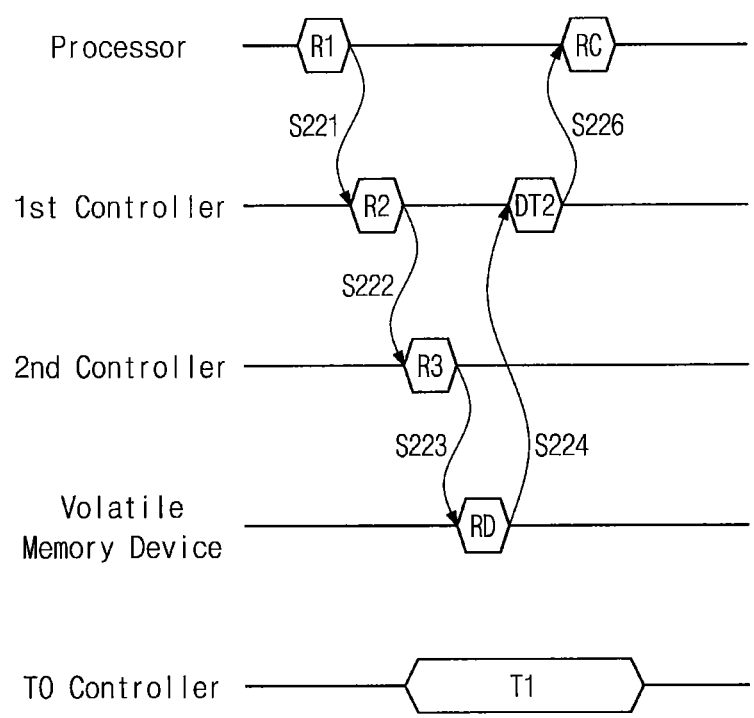
FIG. 5 is a timing diagram of an example read operation illustrated in FIG. 3 according to some embodiments of the present inventive concept.

FIG. 5 is an example for the read operation illustrated in FIG. 4. Referring to FIG. 1 to FIG. 3 and FIG. 5, since operation S221 to operation S223 are the same as operation S211 to operation S213 shown in FIG. 4, detailed description thereof will be omitted.

When the volatile memory device 210 performs the read operation RD, in operation S224, the read data may be directly transmitted to the first controller 130a through the second controller 230 and the first to eighth data buffers 241 to 248 without being controlled and buffered by the second controller 230. Since LRDIMM is based on the dynamic random access memory (DRAM), the volatile memory device 210 may communicate directly with the first controller 130a.

Operation S226 may be the same as operation S216 shown in FIG. 4. When the data read from the volatile memory device 210 is directly transmitted to the first controller 130a, a time until the first controller 130a receives data after transmitting the second read request R2 may be decreased.

Figure 6:
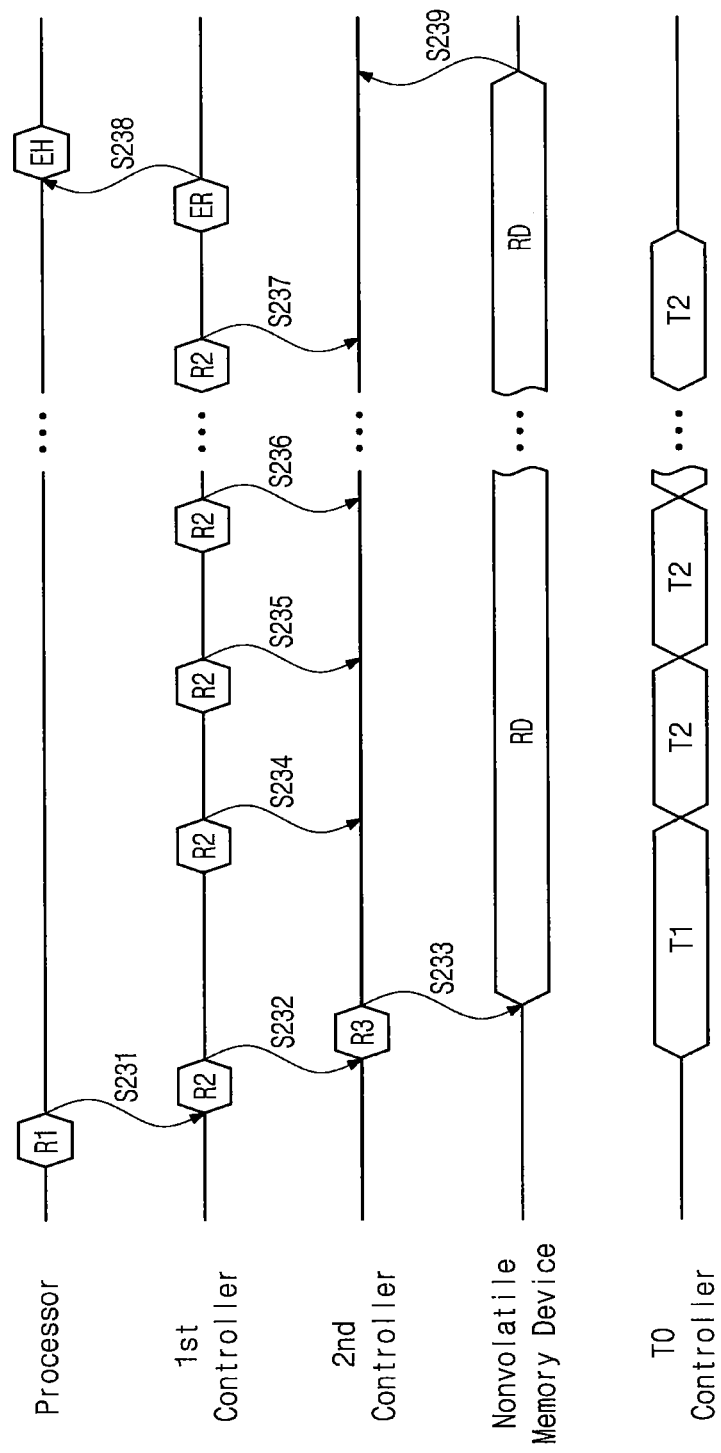
FIG. 6 is an example for describing a read operation according to the operating method illustrated in FIG. 3 according to some embodiments of the present inventive concept.

FIG. 6 is an example embodiment for describing a read operation according to the operating method illustrated in FIG. 3. For example, the first command and address CA1 may be associated with the nonvolatile memory device 220. A read operation performed in the nonvolatile memory device 220 is illustrated in FIG. 6.

Referring to FIG. 1 to FIG. 3 and FIG. 6, the processor 110 may generate a first read request R1. In operation S231, the processor 110 may transmit the first read request R1 to the first controller 130a. The first controller 130a may generate a second read request R2 according to the first read request R1.

In operation S232, the first controller 130a may transmit the second read request R2 to the second controller 230. The second read request R2 may be transmitted to the second controller 230 as the first command and address CAL According to transmitting the second read request R2, the time-out controller 131 may begin measuring (or counting) for the first time T1 (operation S130 shown in FIG. 3). In other words, a timer associated with the first time T1 may be started after transmitting the second read request R2 by the first controller 130a and/or upon receipt of the second read request R2 by the second controller 230.

The second controller 230 may generate a third read request R3 according to the second read request R2. In operation S233, the second controller 230 may transmit the third read request R3 to the nonvolatile memory device 220. The third read request R3 may be transmitted to the nonvolatile memory device 220 as the third command and address CA3.

For example, the second controller 230 may not process the second read request R2 and may transmit the unprocessed second read request R2 to the nonvolatile memory device 220 as the third read request R3. In some embodiments, the second controller 230 may process the second read request R2 into a form appropriate to the nonvolatile memory device 220, and may transmit the processed second read request R2 to the nonvolatile memory device 220 as the third read request R3.

The nonvolatile memory device 220 may perform a read operation RD in response to the third read request R3. Data read from the nonvolatile memory device 220 may be transmitted to the second controller 230.

In an exemplary embodiment, a read speed of the nonvolatile memory device 220 may be lower than a read speed of the volatile memory device 210. A time required to read data from the nonvolatile memory device 220 may be longer than a time required to read data from the volatile memory device 210.

As described above, LRDIMM is based on the dynamic random access memory (DRAM). Therefore, the first time T1 and the second time T2 are determined by a read time of the dynamic random access memory (DRAM). The first time T1 and the second time T2 are shorter than a read time of the nonvolatile memory device 220.

Until the first time T1 passes after the first controller 130a transmits the second read request R2 in operation S232, the read operation RD of the nonvolatile memory device 220 may not be completed. In operation S234, the first controller 130a may retransmit the second read request R2 to the second controller 230 to perform the read retry (operation S150 shown in FIG. 3).

Until the second time T2 passes after the first controller 130a transmits the second read request R2 in operation S234, the read operation RD of the nonvolatile memory device 220 may not be completed. In operation S235, the first controller 130a may retransmit the second read request R2 to the second controller 230 to perform the read retry (operation S150 shown in FIG. 3).

Until the second time T2 passes after the first controller 130a transmits the second read request R2 in operation S235, the read operation RD of the nonvolatile memory device 220 may not be completed. In operation S236 and operation S237, the first controller 130a may retransmit the second read request R2 to the second controller 230 to perform the read retry (operation S150 shown in FIG. 3).

The read operation RD of the nonvolatile memory device 220 may not be completed until the read retry is performed by the number of times of the first value N1. The first controller 130a may determine that the read fail occurs after reaching N1 retries. The first controller 130a may generate an error report ER. The error report ER may be transmitted to the processor 110 in operation S238. The processor 110 may perform error handing EH, according the error report ER. The error handing EH may include exception handling comprising known processes such as machine check handling.

In operation S239, the read operation RD of the nonvolatile memory device 220 may be completed, and data may be transmitted to the second controller 230. However, the first controller 130a may have already determined that the read fail occurs. Therefore, when the read operation to the nonvolatile memory device 220 of the main memory 140a is performed, the read operation to the main memory 140a may be failed by a difference between the read speed of the nonvolatile memory device 220 and the read speed of the volatile memory device 210.

To solve this problem, the first controller 130a, according to embodiments of the inventive concept, may perform the read retry without a limitation to a number of times. For example, the first value N1 may be stored in the register 132. The first controller 130a according to embodiments of the inventive concept may invalidate the first value N1 stored in the register 132 or may set the first value N1 to infinity or a very large number that logically approaches infinity.

Figure 7:
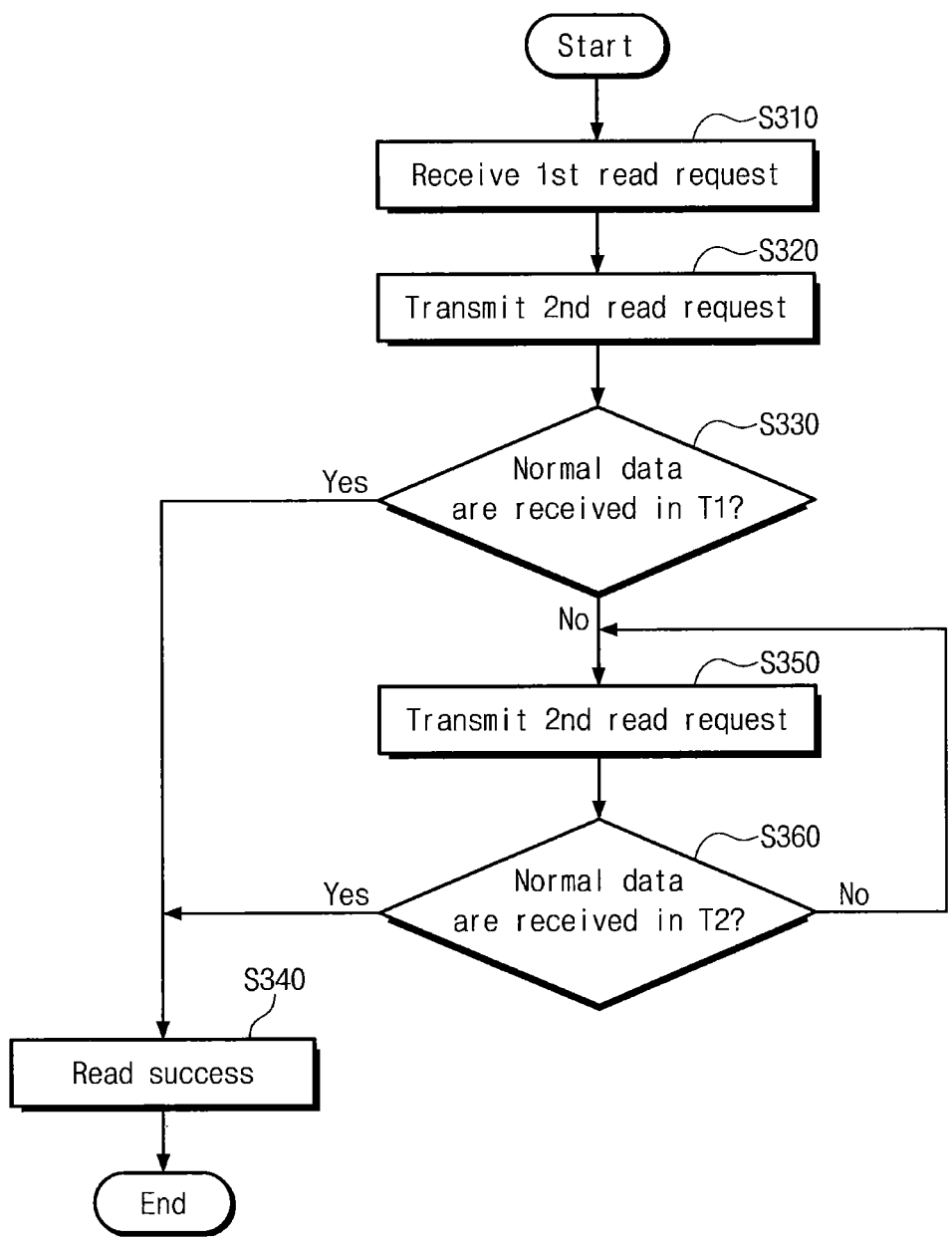
FIG. 7 is a flowchart for describing an operating method of the first controller 130a according to some embodiments of the present inventive concept.

FIG. 7 is a flowchart for describing an operating method of the first controller 130a according to some embodiments of the inventive concept. Referring to FIG. 1, FIG. 2, and FIG. 7, in operation S310, the first controller 130a may receive a first read request. For example, the first controller 130a may receive the first read request from the processor 110.

In operation S320, the first controller 130a may transmit a second read request to the second controller 230. For example, the first controller 130a may generate the second read request using the first read request. A format of the first read request may be the same as or different from a format of the second read request. One or more the second read requests may be generated from one first read request.

In operation S330, the first controller 130a may determine whether a normal data is received within a first time T1. When the normal data is received within the first time T1, in operation S340, a read success may be determined. The first controller 130a may transmit the received normal data to the processor 110.

When the normal data is not received within the first time T1 or the error data is received within the first time T1, in operation S350, the first controller 130a may retransmit the second read request to the second controller 230 to perform a read retry.

In operation S360, the first controller 130a may determine whether the normal data is received within a second time T2. The second time T2 may be shorter than the first time T1. When the normal data is received within the second time T2, in operation S340, the read success may be determined.

When the normal data is not received within the second time T2, the first controller 130a may perform the read retry in operation S350. That is, the first controller 130a may retransmit the read request without the limitation to the number of times.

Figure 8:
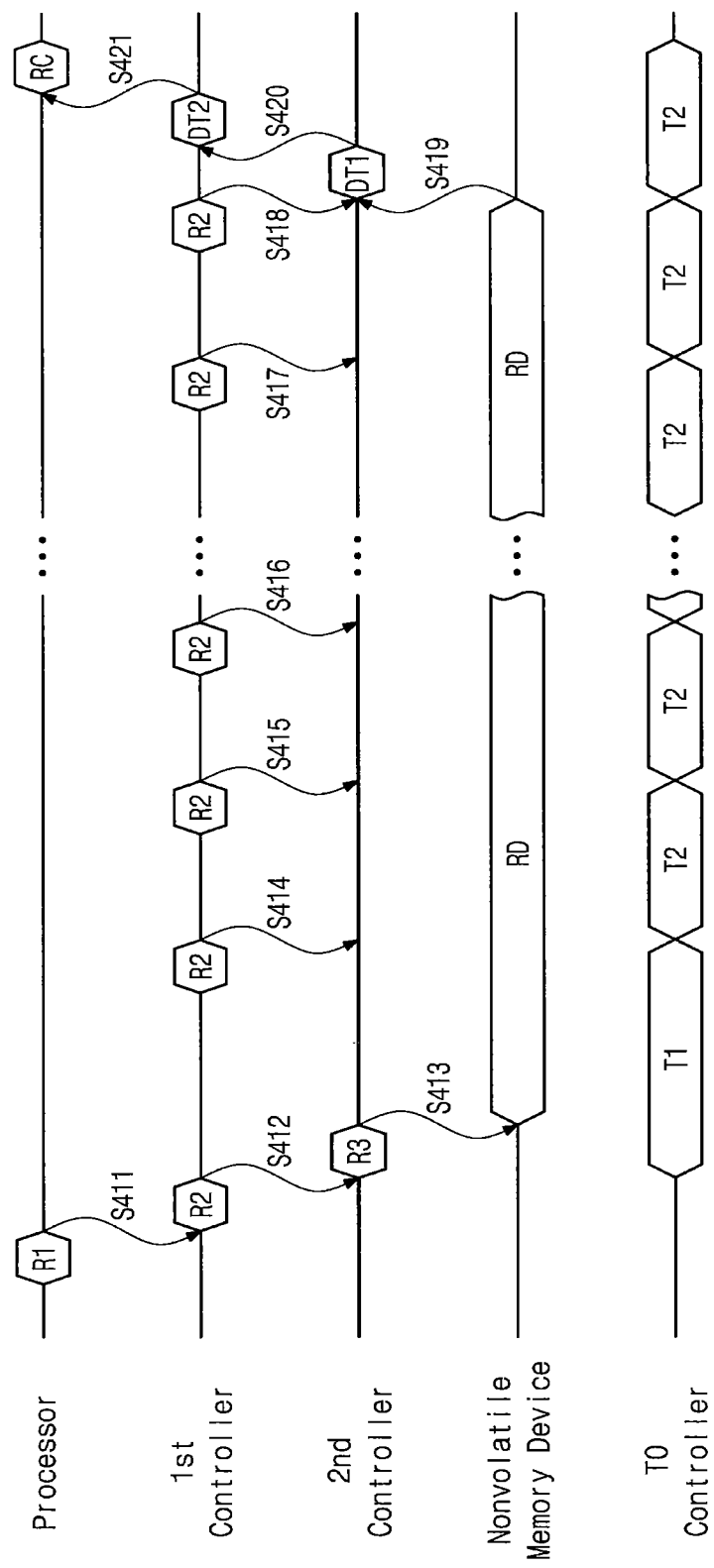
FIG. 8 is an example for describing a read operation according to the operating method illustrated in FIG. 7 according to some embodiments of the present inventive concept.

FIG. 8 is an example for describing a read operation according to the operating method illustrated in FIG. 7. For example, the first command and address CA1 may be associated with the nonvolatile memory device 220, and a read operation performed in the nonvolatile memory device 220 is illustrated in FIG. 8.

Referring to FIG. 1, FIG. 2, FIG. 7, and FIG. 8, the processor 110 may generate a first read request R1. In operation S411, the processor 110 may transmit the first read request R1 to the first controller 130a. The first controller 130a may generate a second read request R2 according to the first read request R1.

In operation S412, the first controller 130a may transmit the second read request R2 to the second controller 230. The second read request R2 may be transmitted to the second controller 230 as the first command and address CAL According to transmitting the second read request R2, the time-out controller 131 may begin measuring (or counting) for the first time T1 (operation S330 shown in FIG. 7).

The second controller 230 may generate a third read request R3 according to the second read request R2. In operation S413, the second controller 230 may transmit the third read request R3 to the nonvolatile memory device 220. The third read request R3 may be transmitted to the nonvolatile memory device 220 as the third command and address CA3.

The nonvolatile memory device 220 may perform a read operation RD in response to the third read request R3. Data read from the nonvolatile memory device 220 may be transmitted to the second controller 230.

Until the first time T1 passes after the first controller 130a transmits the second read request R2 in operation S412, the read operation RD of the nonvolatile memory device 220 may not be completed. In operation S414, the first controller 130a may retransmit the second read request R2 to the second controller 230 to perform the read retry (operation S350 shown in FIG. 7).

Until the second time T2 passes after the first controller 130a transmits the second read request R2 in operation S414, the read operation RD of the nonvolatile memory device 220 may not be completed. In operation S415, the first controller 130a may retransmit the second read request R2 to the second controller 230 to perform the read retry (operation S350 shown in FIG. 7).

Similarly, as the second time T2 passes, the first controller 130a may retransmit the second read request R2 to the second controller 230 to perform the read retry in operation S416 to operation S418. While the read operation RD is performed in the nonvolatile memory device 220, the second controller 230 may ignore the second read requests (e.g., the second read requests received in operation S414 to operation S418) received in association with the read operation RD.

In operation S419, the read operation RD may be completed in the nonvolatile memory device 220, and the read data may be transmitted to the second controller 230. The second controller 230 may perform a first data transmission DT1 to transmit the data read from the nonvolatile memory device 220 to the first controller 130a. In operation S420, the first data transmission DT1 may be completed, and the data may be transmitted to the first controller 130a.

The first controller 130a may receive data from the main memory 140a before the second time T2 passes after transmitting the second read request R2 in operation S418. For example, the received data may be the normal data. Therefore, the first controller 130a may determine the read success.

The first controller 130a may perform a second data transmission DT2 to transmit data received from the second controller 230 to the processor 110. In operation S421, the second data transmission DT2 may be completed, and the data may be transmitted to the processor 110. The processor 110 may determine a read completion RC.

As described above, since the first controller 130a may perform the read request without the limitation to the number of times, the normal data may be read from the nonvolatile memory device 220.

Figure 9:
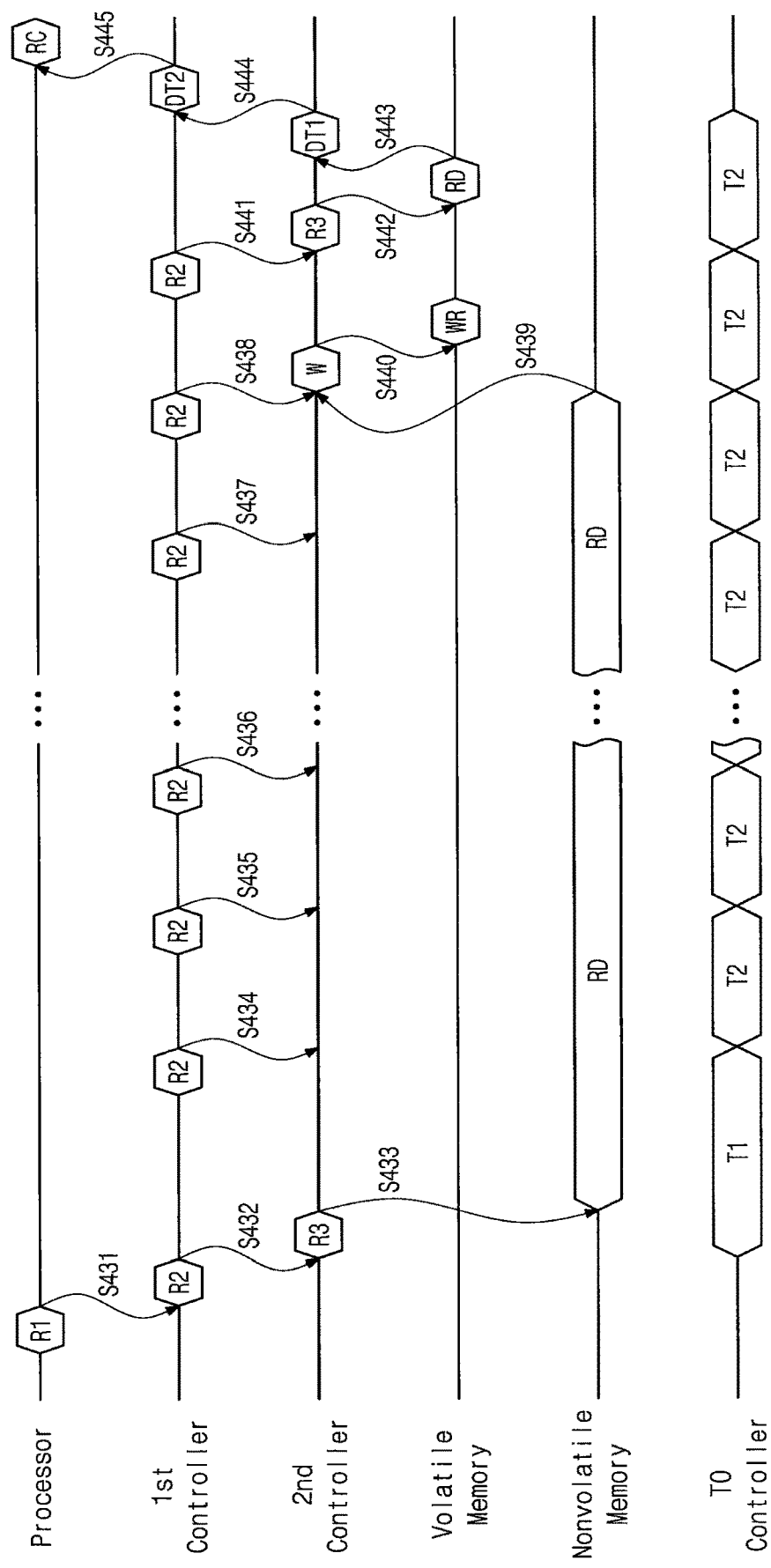
FIG. 9 is an example for describing a read operation according to the operating method illustrated in FIG. 7 according to some embodiments of the present inventive concept.

FIG. 9 is an example for describing a read operation according to the operating method illustrated in FIG. 7. For example, the first command and address CA1 may be associated with the nonvolatile memory device 220, and an example in which the volatile memory device 210 is used as the cache memory of the nonvolatile memory device 220 is illustrated in FIG. 9.

Referring to FIG. 1, FIG. 2, FIG. 7, and FIG. 9, in operation S431, the processor 110 may transmit a first read request R1 to the first controller 130a. The first controller 130a may generate a second read request R2 according to the first read request R1.

In operation S432, the first controller 130a may transmit the second read request R2 to the second controller 230. The second read request R2 may be transmitted to the second controller 230 as the first command and address CA1. According to transmitting the second read request R2, the time-out controller 131 may begin measuring (or counting) for the first time T1 (operation S330 shown in FIG. 7).

The second controller 230 may determine whether a storage space associated with the second read request R2 is mapped to the volatile memory device 210 (i.e., whether it is a cache hit). When the storage space associated with the second read request R2 is mapped to the volatile memory device 210, that is, when the cache hit occurs, the second controller 230 may transmit a third read request R3 as the second command and address CA2 or the second control signal CTRL2 to the volatile memory device 210.

A read operation of the volatile memory device 210 is the same as that of the volatile memory device 210 described with reference to FIG. 4 or FIG. 5. Therefore, detailed description thereof will be omitted.

When the storage space associated with the second read request R2 is not mapped to the volatile memory device 210, that is, when the cache miss occurs, the second controller 230 may map the storage space associated with the second read request R2 to the volatile memory device 210.

The second controller 230 may generate a third read request R3 for storage space associated with the second read request R2. In operation S433, the second controller 230 may transmit the third read request R3 to the nonvolatile memory device 220. The third read request R3 may be transmitted to the nonvolatile memory device 220 as the third command and address CA3.

The nonvolatile memory device 220 may perform a read operation RD in response to the third read request R3. Data read from the nonvolatile memory device 220 may be transmitted to the second controller 230.

As the first time T1 or the second time T2 passes or expires, the first controller 130a may transmit the second read request R2 to perform the read retry in operation S434 to operation S438. The second read request R2 may be transmitted repeatedly, as needed, to produce a successful read operation.

In operation S439, the read operation RD of the nonvolatile memory device 220 may be completed successfully, and the data read from the nonvolatile memory device 220 may be transmitted to the second controller 230.

As the data is transmitted from the nonvolatile memory device 220, in operation S440, the second controller 230 may transmit a write request W to the volatile memory 210. The write request W may include the data read from the nonvolatile memory device 220. In some embodiments, the write request W may be transmitted with the data read from the nonvolatile memory device 220.

For example, the write request W may be transmitted to the volatile memory device 210 as the second command and address CA2. In some embodiments, the write request W may be transmitted to the volatile memory device 210 as the second control signal CTRL2. For example, the second controller 230 may activate a particular control signal such as SAVEn.

While the particular control signal is activated, the second controller 230 may transmit the data read from the nonvolatile memory device 220 to the volatile memory device 210. The volatile memory device 210 may write the data received from the second controller 230 in response to the activated particular control signal.

The volatile memory device 210 may perform a write operation WR according to the write request W. Since the volatile memory device 210 performs a write operation WR, the first storage space of the nonvolatile memory device 220 associated with the second read request R2 may be mapped (or backed up) to the second storage space of the volatile memory device 210.

After the write operation WR is completed, in operation S441, the first controller 130a may transmit the second read request R2 to the second controller 230. In operation S442, the second controller 230 may transmit the third read request R3 to the volatile memory device 210 in response to the second read request R2 received in operation S441 after the read operation RD is completed. The third read request R3 may request a read of data mapped from the nonvolatile memory device 220 to the volatile memory device 210.

The volatile memory device 210 may perform the read operation RD in response to the third read request R3. When the read operation RD is completed, in operation S443, data associated with the second read request R2 may be transmitted to the second controller 230. The second controller 230 may perform a first data transmission DT1.

As the first data transmission DT1 is performed, in operation S444, the data may be transmitted to the first controller 130a. The first controller 130a may receive the data associated with the second read request R2 before the second time T2 passes after transmitting the second read request R2 in operation S441. Therefore, the first controller 130a may determine the read success (operation S340 shown in FIG. 7).

The first controller 130a may perform a second data transmission DT2 to transmit the data to the processor 110. As the data is transmitted, the processor 110 may determine a read completion.

Figure 10:
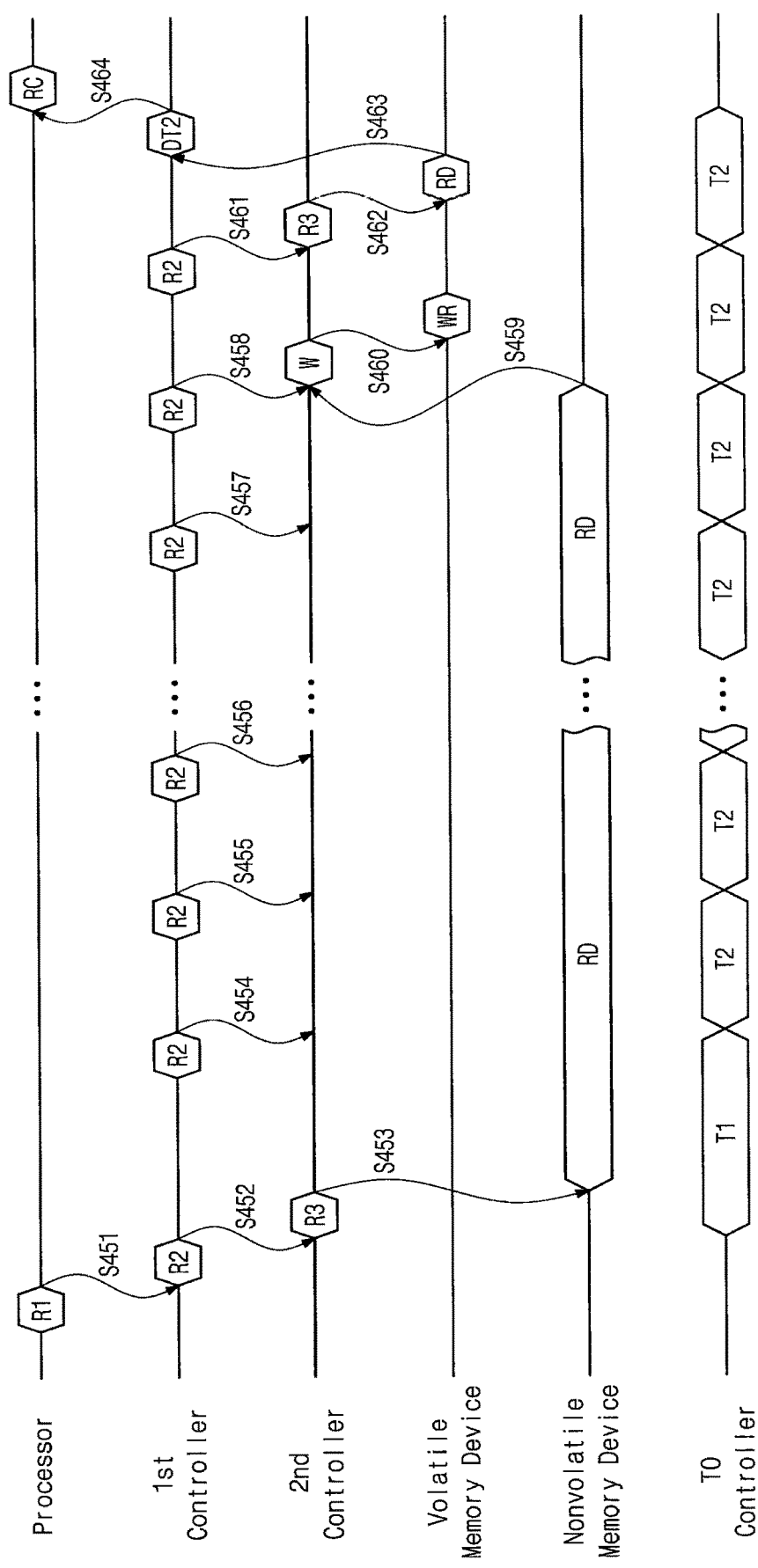
FIG. 10 is an example for the read operation illustrated in FIG. 7 according to some embodiments of the present inventive concept.

FIG. 10 is an example for the read operation illustrated in FIG. 9. Referring to FIG. 1, FIG. 2, FIG. 7, and FIG. 10, since operation S451 to operation S460 are the same as operation S431 to operation S440 shown in FIG. 9, detailed description thereof will be omitted.

In operation S461 of FIG. 10, the first controller 130a may transmit the second read request R2 to the second controller 230. In operation S462, the second controller 230 may transmit the third read request R3 to the volatile memory device 210 in response to the second read request R2. For example, the second controller may transmit the second read request R2 received from the first controller 130a to the volatile memory device 210 as the third read request R3.

When the volatile memory device 210 performs the read operation RD, in operation S463, the read data may be directly transmitted to the first controller 130a through the second controller 230 and the first to eighth data buffers 241 to 248 without being controlled and buffered by the second controller 230. Since LRDIMM is based on the dynamic random access memory (DRAM), the volatile memory device 210 may communicate directly with the first controller 130a.

Operation S464 may be the same as operation S445 shown in FIG. 9. When the data read from the volatile memory device 210 is directly transmitted to the first controller 130a, a time until the first controller 130a receives data after transmitting the second read request R2 may be decreased.

Figure 11:
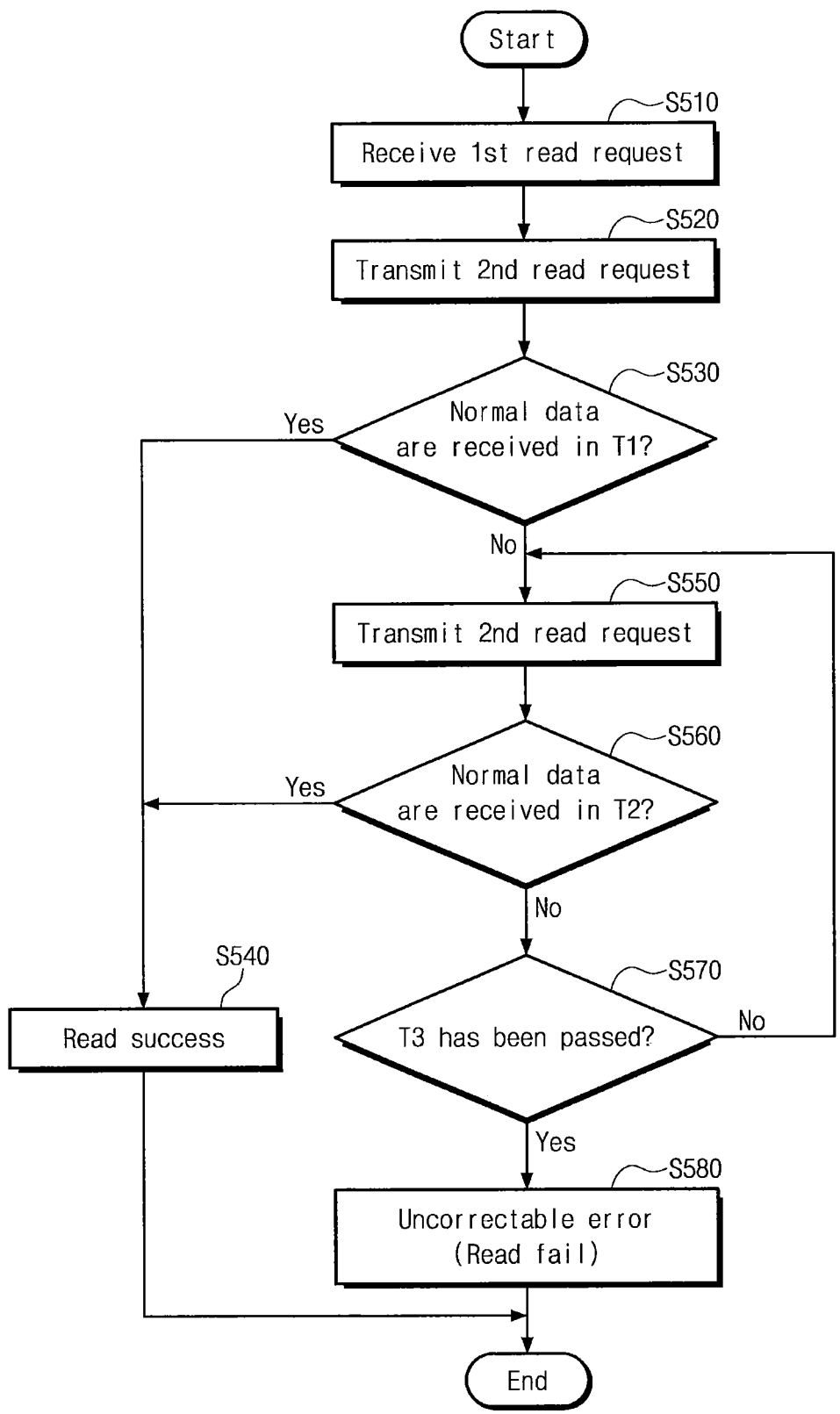
FIG. 11 is a flowchart for describing an application example of the operating method illustrated in FIG. 7 according to some embodiments of the present inventive concept.

FIG. 11 is a flowchart for describing an application example of the operating method illustrated in FIG. 7. Referring to FIG. 1, FIG. 2, and FIG. 11, operation S510 to operation S550 may be the same as operation S310 to operation S350 described with reference to FIG. 7. That is, the first controller 130a may perform the read retry without the limitation to the number of times.

In operation S560, when the normal data is not received within the second time T2, operation S570 may be performed. In operation S570, after the second read request R2 is transmitted for the first time, it is determined whether a third time T3 has been passed. When the third time T3 is not passed, in operation S550, the read retry may be performed without the limitation to the number of times.

When the third time T3 is passed, in operation S580, the first controller 130a may determine a read fail when an uncorrectable error occurs. In some embodiments, information on the third time T3 may be stored in the register 132.

The third time T3 may be determined according to a time (e.g., a read time) required to perform the read operation in the nonvolatile memory device 220. For example, the third time T3 may be longer (e.g., twice or more) than the read time.

Figure 12:
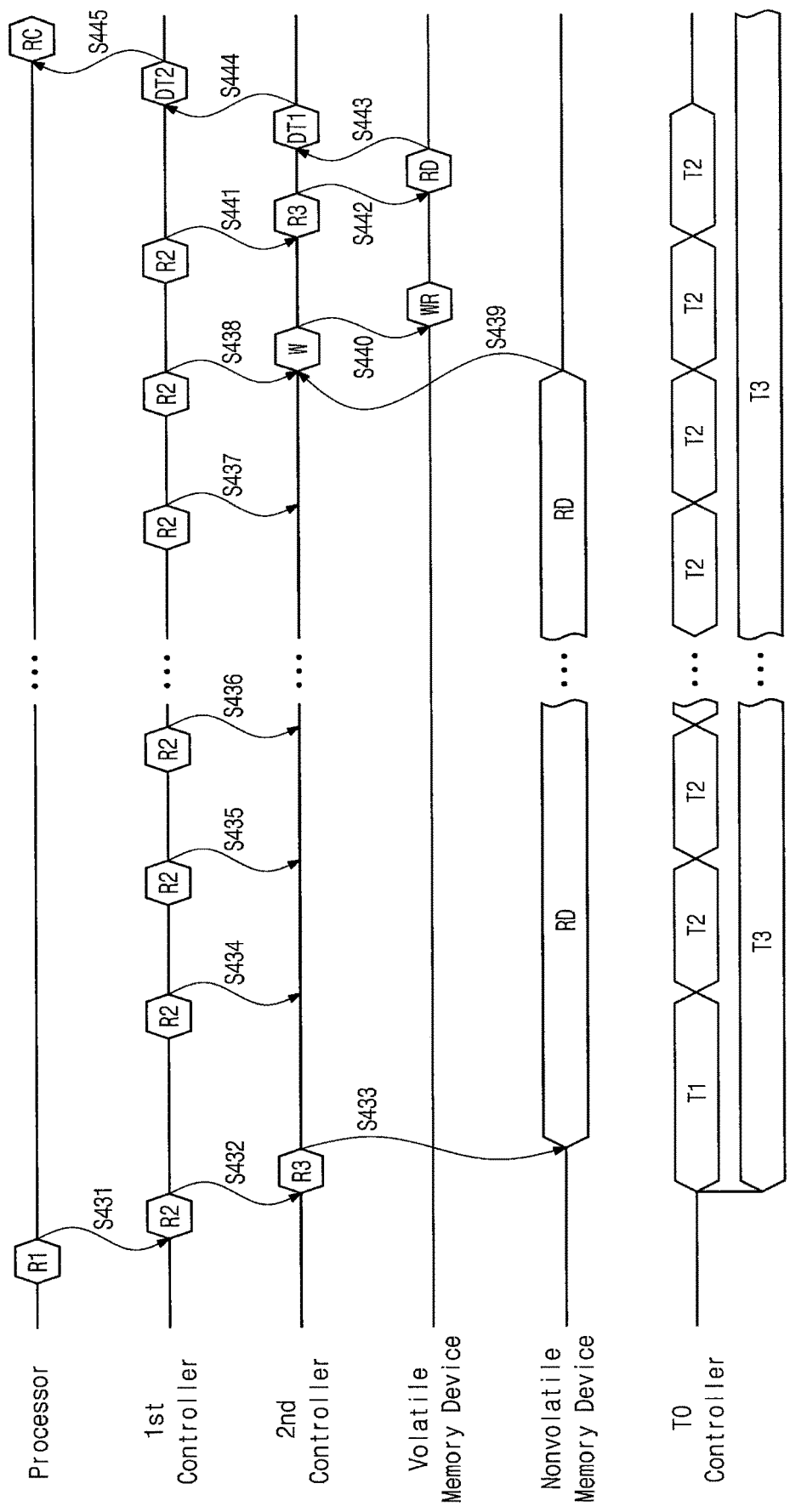
FIG. 12 is an example of performing a read operation with measuring the third time T3 according to some embodiments of the present inventive concept.

FIG. 12 is an example of performing a read operation with measuring the third time T3. Compared with FIG. 9, in operation S432, as the first controller 130a transmits the second read request R2 to the second controller 230, the time-out controller 131 may begin measuring (or counting) for the third time T3.

In some embodiments, the third time T3 may be longer than a time when a read operation to the nonvolatile memory device 220 is performed. When a time-out is measured, the first controller 130a may be prevented from repeatedly performing the read retry when the normal data is not read due to an error in the main memory 140a. That is, a hang may be prevented from occurring in a memory system including the first controller 130a and the main memory 140a.

Figure 13:
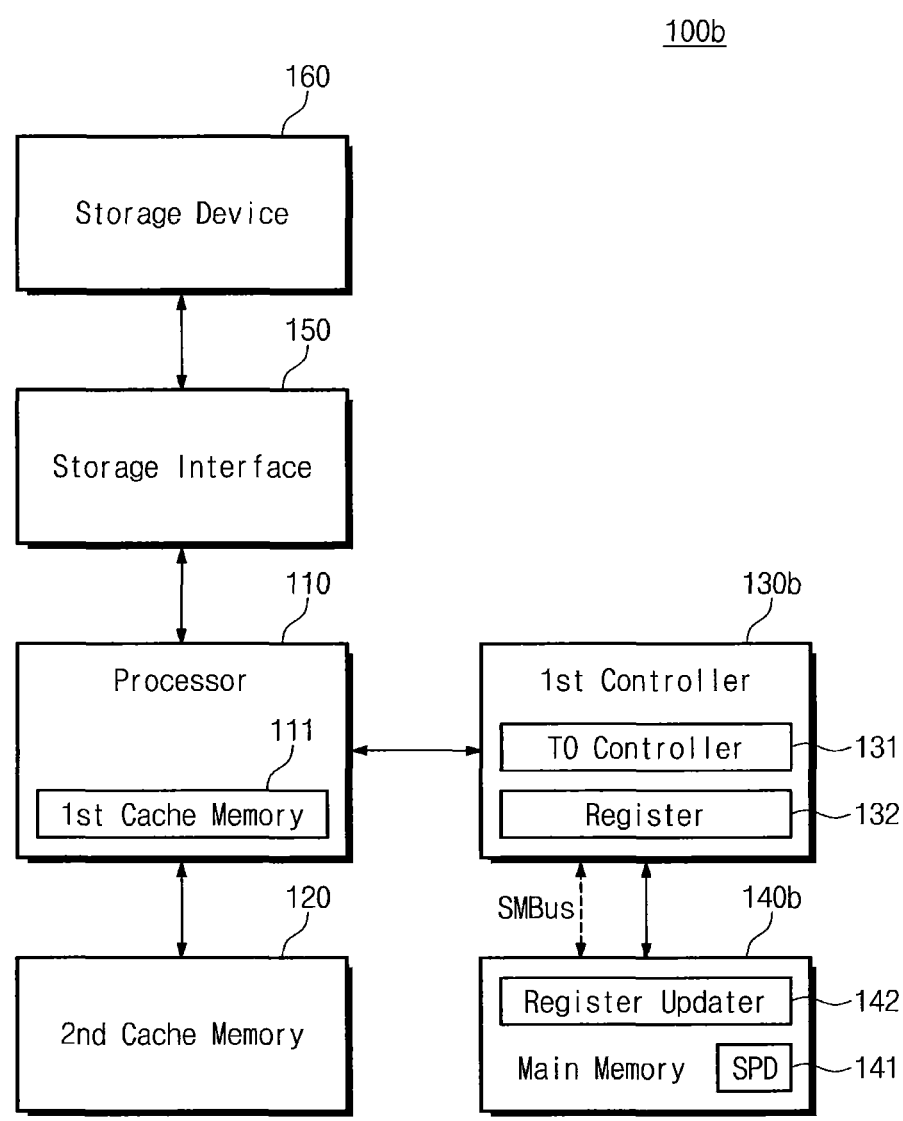
FIG. 13 is a block diagram illustrating a computing device according to some embodiments of the present inventive concept.

FIG. 13 is a block diagram illustrating a computing device 100b according to some embodiments of the inventive concept. Referring to FIG. 13, the computing device 100b may include a processor 110, a second cache memory 120, a first controller 130b, a main memory 140b, a storage interface 150, and a storage device 160.

Operations of the processor 110, the second cache memory 120, the storage interface 150, and the storage device 160 may be the same as or similar to those of the processor 110, the second cache memory 120, the storage interface 150, and the storage device 160 described with reference to FIG. 1. Therefore, detailed description thereof will be omitted.

Compared with FIG. 1, the first controller 130b may further communicate with the main memory 140b through a system management bus SMBus. The main memory 140b may include a serial presence detect (SPD) device 141 and a register updater 142. SPD device 141 may make it possible for the first controller 130b to know that the main memory 140b is present, and what timings to use to access the main memory 140b.

The SPD device 141 may include information on the main memory 140b. When a power is supplied to the first controller 130b and the main memory 140b, the first controller 130b may access the SPD device 141 of the main memory 140b to acquire the information on the main memory 140b.

Based on the acquired information, the first controller 130b may set or adjust methods or parameters to access the main memory 140b. For example, the first controller 130b may access the SPD device 141 through the system management bus SMBus.

The register updater 142 may update a register 132 of the first controller 130b through the system management bus SMBus. For example, when the first controller 130b accesses the SPD device 141 of the main memory 140b, the first controller 130b may allow the main memory 140b to access the register 132 through the system management bus SMBus.

While the first controller 130b accesses the SPD device 141, the register updater 142 may update some of information stored in the register 132. For example, the register updater 142 may update information stored in the register 132 so that operations described with reference to FIG. 7 to FIG. 12 are allowed.

Figure 14:
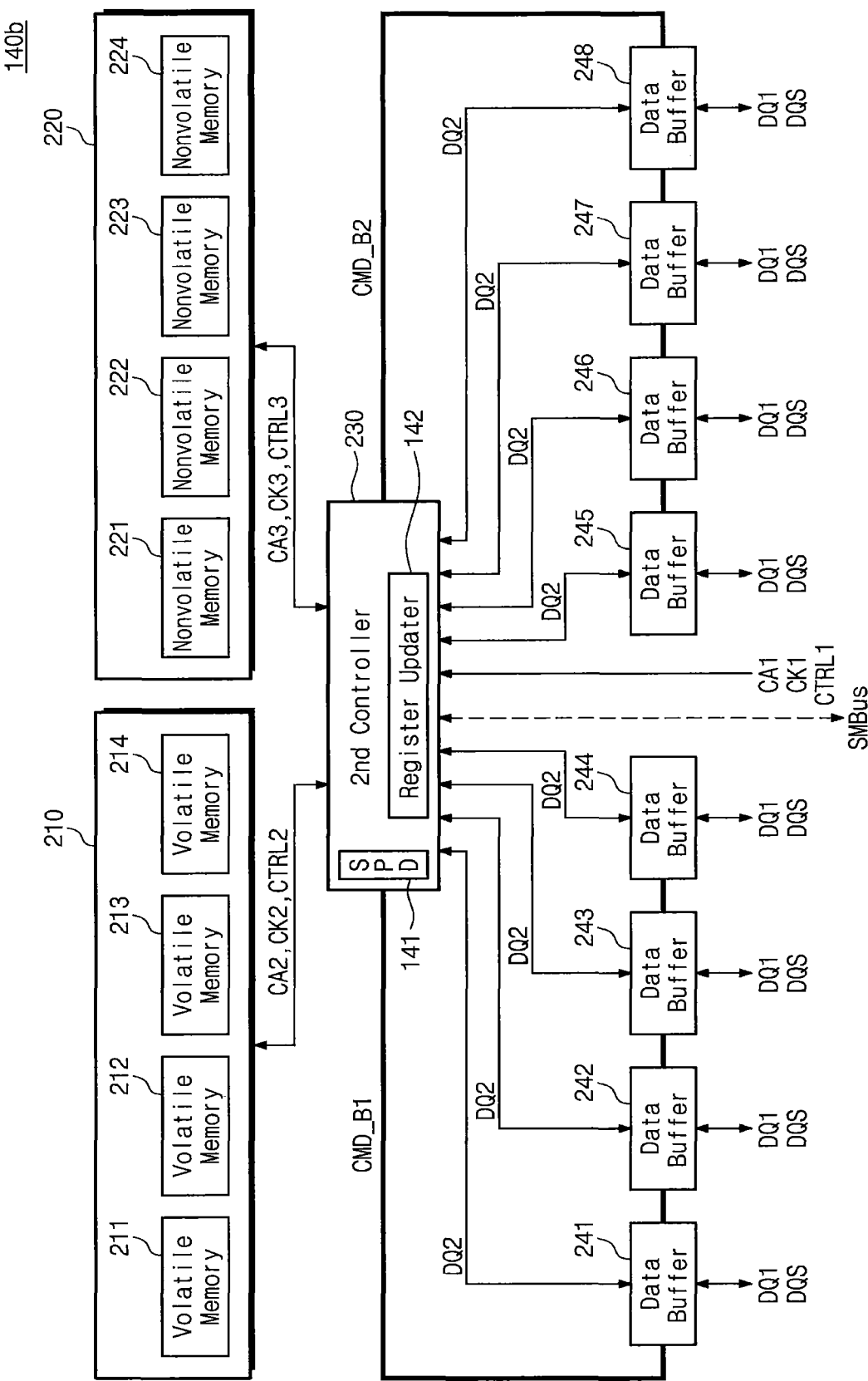
FIG. 14 is a block diagram of a main memory including a SPD device and a register updater according to some embodiments of the present inventive concept.

FIG. 14 is block diagram illustrating the main memory 140b including the SPD device 141 and the register updater 142. Compared with FIG. 2, a second controller 230 may include the SPD device 141 and the register updater 142.

The SPD device 141 may be included in the second controller 230, or may be provided as a package separated from the second controller 230 to be disposed outside the second controller 230. The SPD device 141 and the register updater 142 may communicate with the first controller 130b through the system management bus SMBus.

Figure 15:
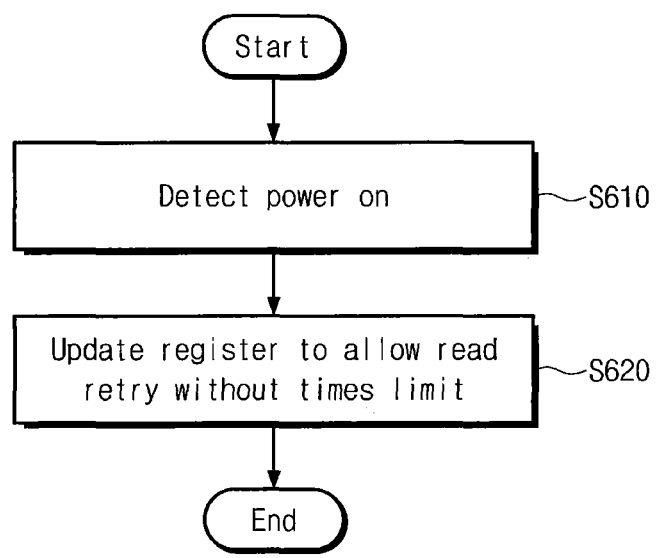
FIG. 15 is a flowchart for describing an operating method of the main memory 140b to update the register 132 according to some embodiments of the present inventive concept.

FIG. 15 is a flowchart for describing an operating method of the main memory 140b to update the register 132. Referring to FIG. 13 to FIG. 15, in operation S610, the second controller 230 may detect a power on. In operation S620, the register updater 142 of the second controller 230 may update information stored in the register 132 through the system management bus SMBus.

For example, the register updater 142 may invalidate or remove times limit stored in the register 132. The register updater 142 may update the third time T3 stored in the register 132 according to a read time of the nonvolatile memory device 220. For example, the register updater 142 may update the register 132 so that the third time T3 is longer than the read time.

Figure 16:
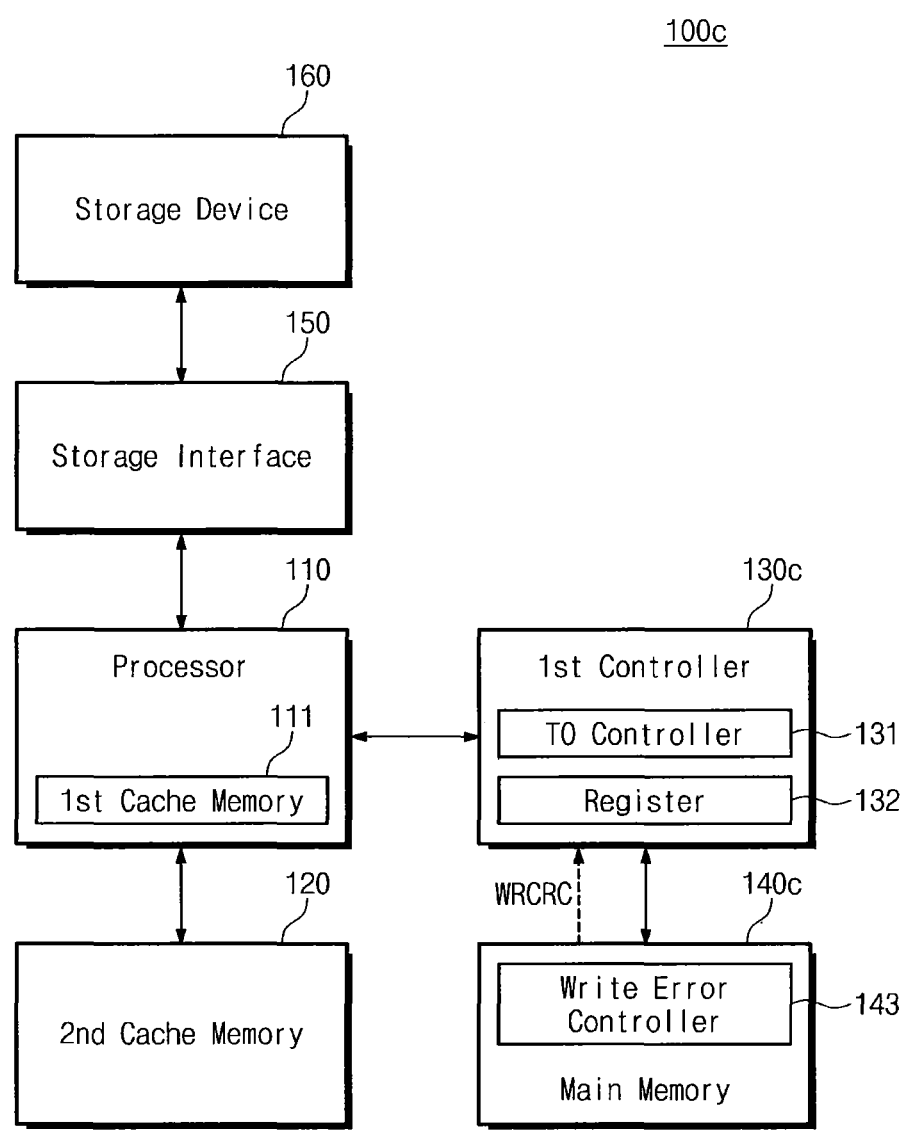
FIG. 16 is a block diagram illustrating a computing device according to some embodiments of the present inventive concept.

FIG. 16 is a block diagram illustrating a computing device 100c according to some embodiments of the inventive concept. Referring to FIG. 2 and FIG. 13, the computing device 100c may include a processor 110, a second cache memory 120, a first controller 130c, a main memory 140c, a storage interface 150, and a storage device 160.

Operations of the processor 110, the second cache memory 120, the storage interface 150, and the storage device 160 may be the same as or similar to those of the processor 110, the second cache memory 120, the storage interface 150, and the storage device 160 described with reference to FIG. 1. Therefore, detailed description thereof will be omitted.

Compared with FIG. 1, the main memory 140c may output a write error signal WRCRC to the first controller 130c. For example, the first controller 130c may transmit a write request to the main memory 140c. A write data of the write request may be transmitted with a parity generated by an error correction code.

The main memory 140c may check whether an error exists in the write data by using the parity. When the error exists in the write data, the main memory 140c may enable (e.g., a low level) the write error signal WRCRC. When the write error signal WRCRC is enabled, the first controller 130c may retransmit the write request.

The main memory 140c may include a write error controller 143. As described with reference to FIG. 14, the write error controller 143 may be included in the second controller 230. When a write to the nonvolatile memory device 220 is performed, the write error controller 143 may control the write error signal WRCRC. For example, the write error signal WRCRC may include ALERTn signal.

Figure 17:
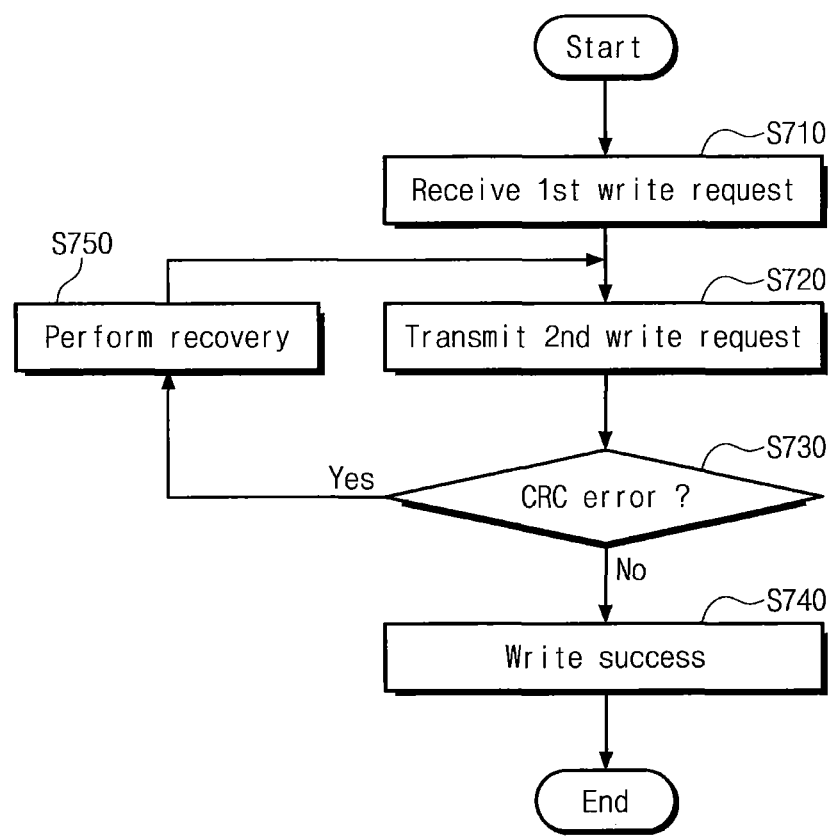
FIG. 17 is a flowchart for describing a write operation of the first controller 130c according to some embodiments of the present inventive concept.

FIG. 17 is a flowchart for describing a write operation of the first controller 130c. Referring to FIG. 2, FIG. 16, and FIG. 17, in operation S710, the first controller 130c may receive a first write request. For example, the first controller 130c may receive the first write request from the processor 110.

In operation S720, the first controller 130c may transmit a second write request to the second controller 230. For example, the first controller 130c may generate the second write request using the first write request. A format of the first write request may be the same as or different from a format of the second write request. One or more the second write requests may be generated from one first write request.

In operation S730, the first controller 130c may check whether the write error signal WRCRC is enabled. When the write error signal WRCRC is disabled, in operation S740, the first controller 130c may determine a write success.

When the write error signal WRCRC is enabled, in operation S750, the first controller 130c may perform a recovery. For example, the first controller 130c may perform a recovery of a communication link between the first controller 130c and the main memory 140c. The recovery may include ZQ calibration, a write training, and/or a read training.

In operation S720, the first controller may retransmit the second write request. That is, the first controller 130a may perform a write retry without the limitation to the number of times.

Figure 18:
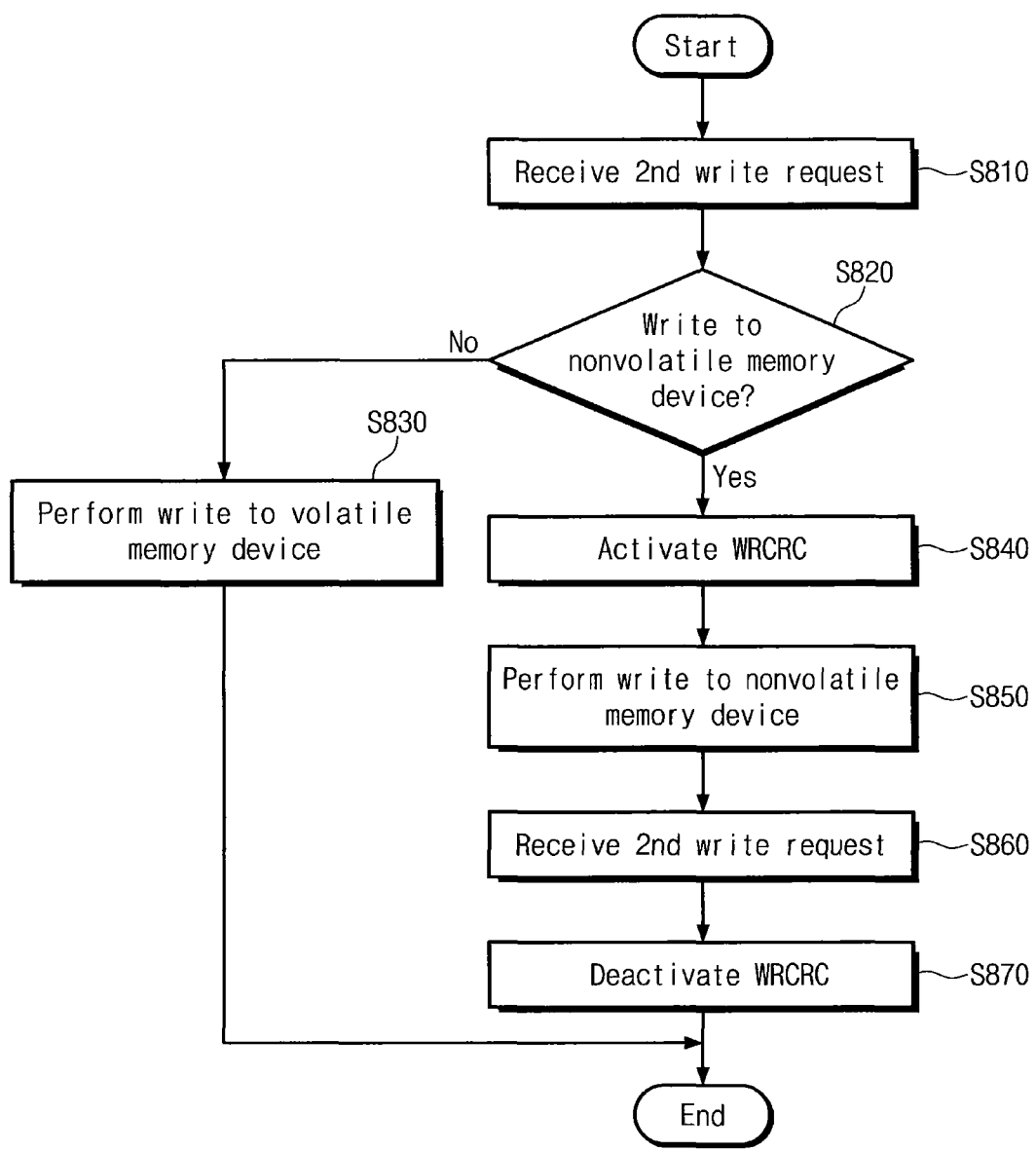
FIG. 18 is a flowchart for describing a write operation of the main memory 140c according to some embodiments of the present inventive concept.

FIG. 18 is a flowchart for describing a write operation of the main memory 140c. Referring to FIG. 2, FIG. 16, and FIG. 18, in operation S810, the second controller 230 may receive a second write request. For example, the second controller 230 may receive the second write request as the first command and address CA1 from the first controller 130c.

In operation S820, the second controller 230 may determine whether the second write request causes a write to the nonvolatile memory device 220. When the second write request does not cause the write to the nonvolatile memory device 220, in operation S830, the second controller 230 may perform a write operation to the volatile memory device 210 according to the second write request.

When the second write request causes the write to the nonvolatile memory device 220, in operation S840, the second controller 230 may activate the write error signal WRCRC. In operation S850, the second controller 230 may perform a write operation to the nonvolatile memory device 220.

After the write operation to the nonvolatile memory device 220 is completed, when the second write request is received in operation S860, in operation S870, the second controller 230 may deactivate (e.g., a high level) the write error signal WRCRC.

As described with reference to FIG. 6, the write operation to the nonvolatile memory device 220 may require a longer time than the write operation to the volatile memory device 210. The first controller 130c may be configured to control the main memory 140c based on a write speed of the volatile memory device 210.

For example, the first controller 130c may transmit the second write request to the main memory 140c, and may determine that the write operation is completed when there is no reply from the main memory 140c (e.g., the write error signal WRCRC is disabled).

When the write operation to the nonvolatile memory device 220 is not completed and the first controller 130c determines a write completion, a write fail may occur. To solve this problem, the main memory 140c according to the embodiment of the inventive concept may hold the write error signal WRCRC as an enabled state (e.g., a low level) until the write operation to the nonvolatile memory device 220 is completed.

Figure 19:
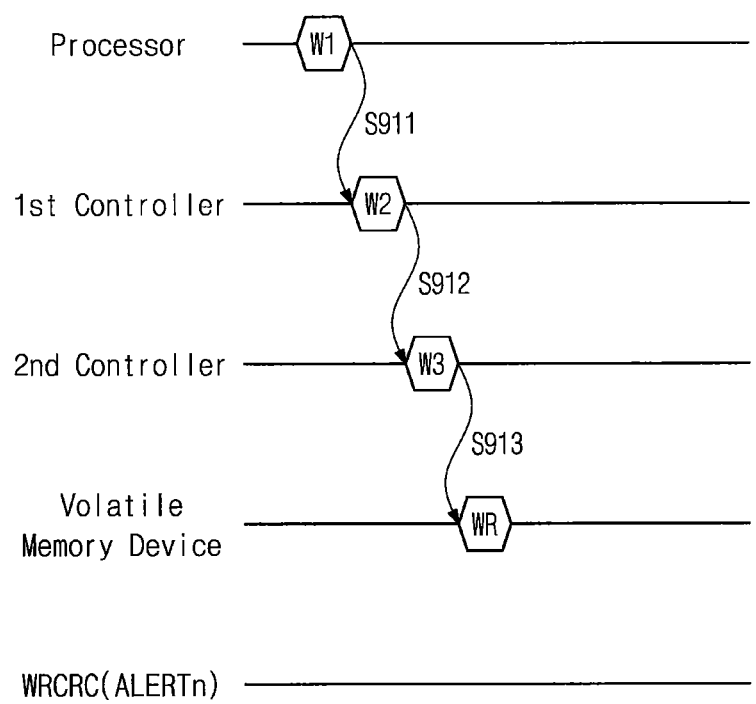
FIG. 19 is an example timing diagram for a write operation according to the operating method illustrated in FIG. 18 according to some embodiments of the present inventive concept.

FIG. 19 is an example for describing a write operation according to the operating method illustrated in FIG. 18. For example, the first command and address CA1 may not be associated with the volatile memory device 210, and a write operation performed in the volatile memory device 210 is illustrated in FIG. 19.

Referring to FIG. 2, FIG. 16, FIG. 18, and FIG. 19, the processor 110 may generate a first write request W1. In operation S911, the processor 110 may transmit the first write request W1 to the first controller 130c. The first controller 130c may generate a second write request W2 according to the first write request W1.

In operation S912, the first controller 130c may transmit the second write request W2 to the second controller 230. The second write request W2 may be transmitted to the second controller 230 as the first command and address CA1.

The second controller 230 may generate a third write request W3 according to the second write request W2. In operation S913, the second controller 230 may transmit the third write request W3 to the volatile memory device 210. The third write request W3 may be transmitted to the volatile memory device 210 as the second command and address CA2.

For example, the second controller 230 may not process the second write request W2 and may transmit the unprocessed second write request W2 to the volatile memory device 210 as the third write request W3. In some embodiments, the second controller 230 may process the second write request W2 into a form appropriate to the volatile memory device 210, and may transmit the processed second write request W2 to the volatile memory device 210 as the third write request W3.

The volatile memory device 210 may perform the write operation WR in response to the third write request W3. In some embodiments, as described with reference to FIG. 5, the first controller 130c may directly write data to the volatile memory device 210 through the second controller 230 and the first to eighth data buffers 241 to 248 without a control or a buffering of the second controller 230.

When an error does not exist in the write data, the second controller 230 may hold the write error signal WRCRC as a disabled state which is the high level. When the error exists in the write data, the second controller 230 may control the write error signal WRCRC as the enabled state which may correspond to the low level. The first controller 130c may retransmit the second write request W2 according to the enabled write error signal WRCRC.

In some embodiments, the second controller 230 or the volatile memory device 210 may check whether an error exists in the write data. The second controller 230 or the volatile memory device 210 may enable the write error signal WRCRC to the low level when the error exists in the write data.

For example, the write error signal WRCRC output from the volatile memory device 210 may be included in the second control signal CTRL2, and may be transmitted to the second controller 230. The second controller 230 may transmit the write error signal WRCRC received from the volatile memory device 210 to the first controller 130c.

Figure 20:
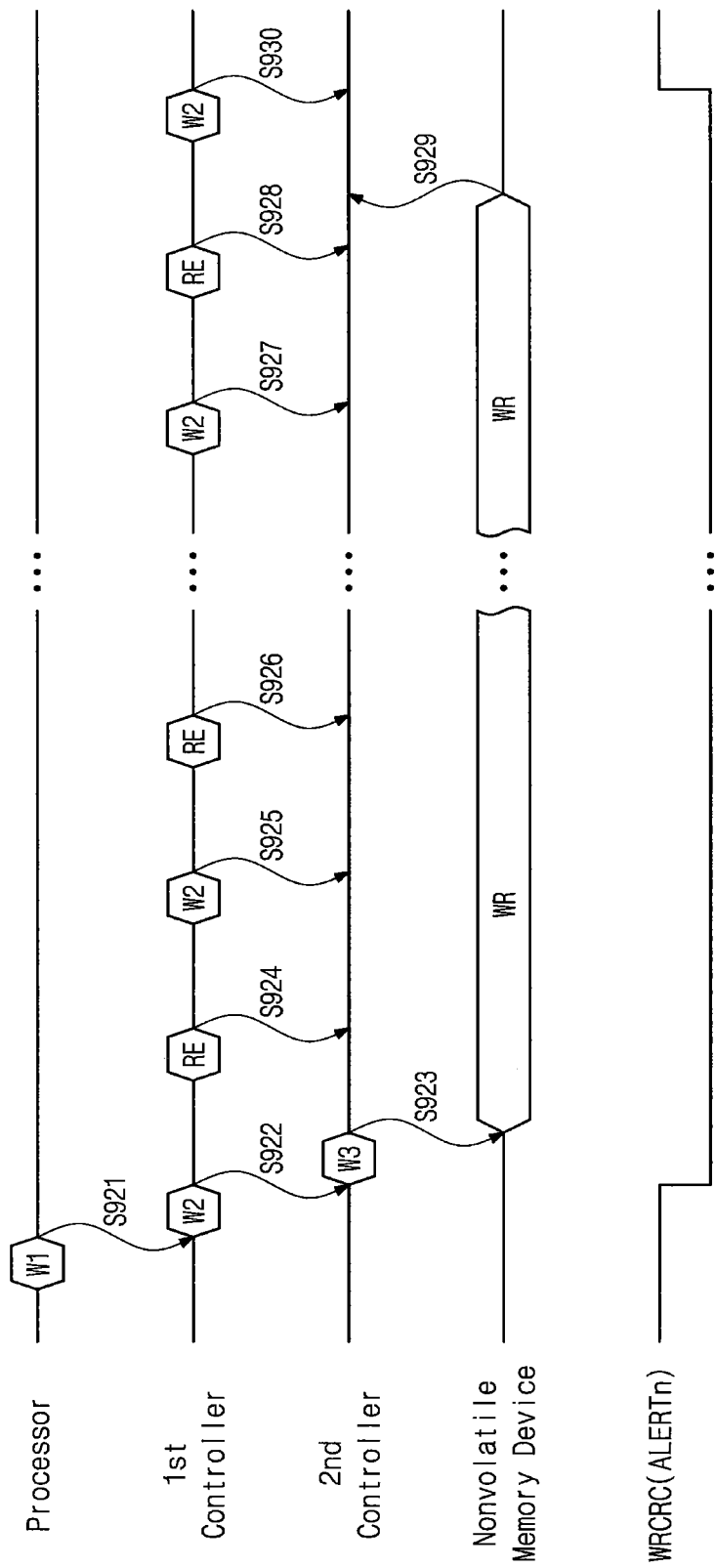
FIG. 20 is an example timing diagram for write operation according to the operating method illustrated in FIG. 18 according to some embodiments of the present inventive concept.

FIG. 20 is an example for describing a write operation according to the operating method illustrated in FIG. 18. For example, a write operation to the nonvolatile memory device 220, which is performed according to the first command and address CA1, is illustrated in FIG. 20.

Referring to FIG. 2, FIG. 16, FIG. 18, and FIG. 20, the processor 110 may generate a first write request W1. In operation S921, the processor 110 may transmit the first write request W1 to the first controller 130c. The first controller 130c may generate a second write request W2 according to the first write request W1.

In operation S922, the first controller 130c may transmit the second write request W2 to the second controller 230. The second write request W2 may be transmitted to the second controller 230 as the first command and address CAL The second write request W2 may cause the write operation to the nonvolatile memory device 220. Therefore, when the second write request W2 is received, the second controller 230 may enable the write error signal WRCRC to the low level.

The second controller 230 may generate a third write request W3 according to the second write request W2. In operation S923, the second controller 230 may transmit the third write request W3 to the nonvolatile memory device 220. The third write request W3 may be transmitted to the nonvolatile memory device 220 as the third command and address CA3.

For example, the second controller 230 may not process the second write request W2 and may transmit the unprocessed second write request W2 to the nonvolatile memory device 220 as the third write request W3. In some embodiments, the second controller 230 may process the second write request W2 into a form appropriate to the nonvolatile memory device 220, and may transmit the processed second write request W2 to the nonvolatile memory device 220 as the third write request W3.

The nonvolatile memory device 220 may perform a write operation WR in response to the third write request W3. When the write error signal WRCRC is enabled, in operation S924, the first controller 130c may perform a recovery RE. After the recovery RE is performed, in operation S925, the first controller 130c may retransmit the second write request W2 to perform the write retry.

While the write operation WR is performed in the nonvolatile memory device 220, the first controller 130c may repeatedly perform the recovery RE and the write retry in operation S926 to operation S928 according to the enabled write error signal WRCRC.

In operation S929, the nonvolatile memory device 220 may inform the second controller 230 that the write operation WR is completed. For example, the nonvolatile memory device 220 may control a ready/busy signal (R/nB) so that the ready/busy signal (R/nB) indicates a ready condition. When the ready/busy signal (R/nB) indicates the ready condition, the nonvolatile memory device 220 may inform the second controller 230 that the write operation WR is completed.

In operation S930, the first controller 130c may transmit the second write request W2 to the second controller 230 to perform the write retry. In operation S930, as the second write request W2 is received, the second controller 230 may disable the write error signal WRCRC to the high level. As the write error signal WRCRC is disabled, the first controller 130c may determine that the write operation WR is completed.

As described above, when the write operation WR to the nonvolatile memory device 220 is performed, the second controller 230 may enable the write error signal WRCRC even though no error occurs. As the write error signal WRCRC is enabled, the first controller 130c may retransmit the write request without a limitation on the number of times. Therefore, the first controller 130c is held and the write error is prevented until the write operation WR to the nonvolatile memory device 220 is performed.

Figure 21:
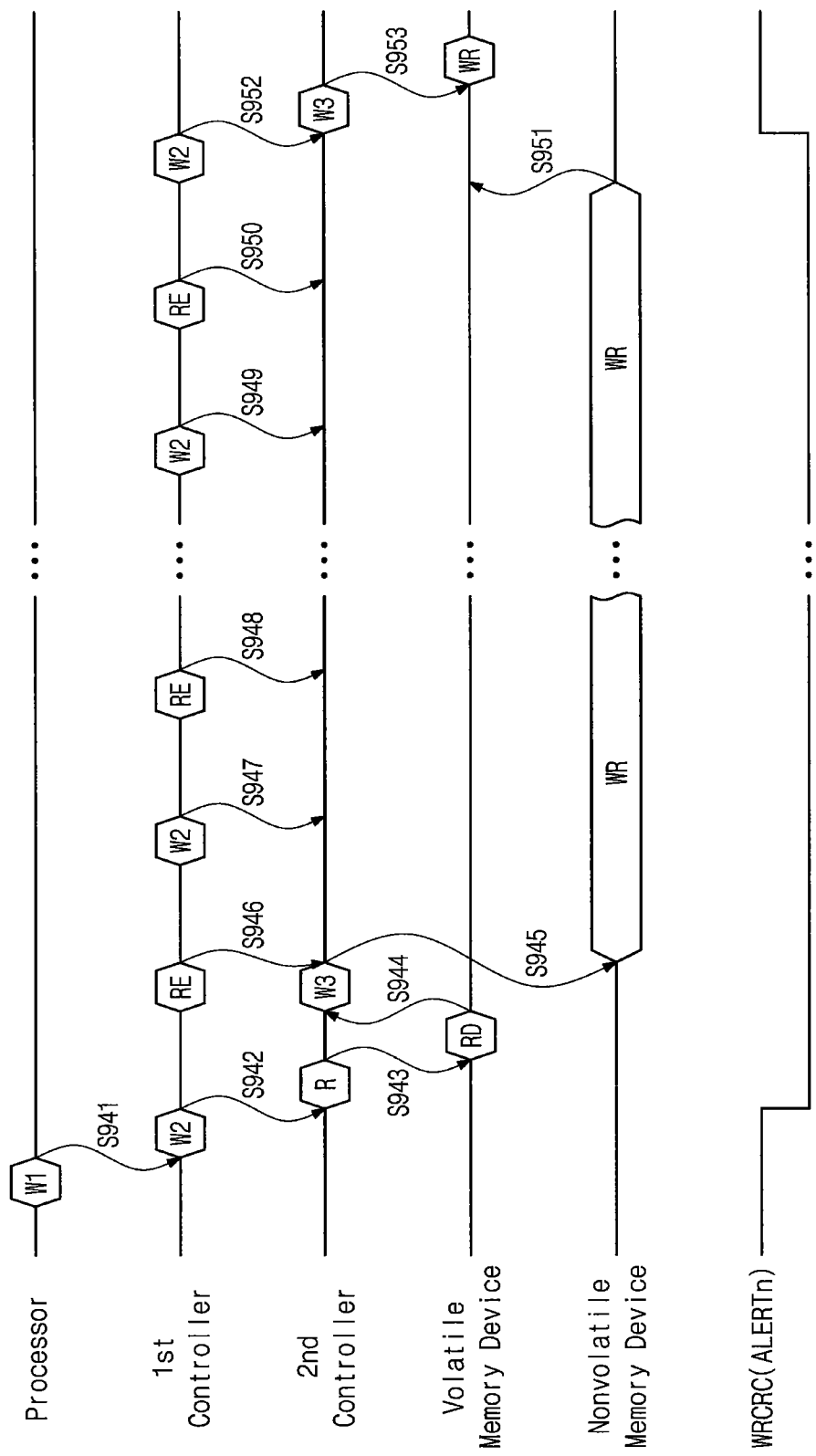
FIG. 21 is an example timing diagram for a write operation according to the operating method illustrated in FIG. 18 according to some embodiments of the present inventive concept.

FIG. 21 is an example for describing a write operation according to the operating method illustrated in FIG. 19. For example, the first command and address CA1 may be associated with the nonvolatile memory device 220, and an example in which the volatile memory device 210 is used as the cache memory of the nonvolatile memory device 220 is illustrated in FIG. 21.

Referring to FIG. 2, FIG. 16, FIG. 19, and FIG. 21, the processor 110 may generate the first write request W1. In operation S941, the processor 110 may transmit the first write request W1 to the first controller 130c. The first controller 130c may generate the second write request W2 according to the first write request W1.

In operation S942, the first controller 130c may transmit the second write request W2 to the second controller 230. The second write request W2 may be transmitted to the second controller 230 as the first command and address CAL The second controller 230 may determine whether a storage space associated with the first command and address CA1 is mapped to the volatile memory device 210.

For example, the storage space associated with the first command and address CA1 may not be mapped to the volatile memory device 210. Additionally, the write operation to the nonvolatile memory device 220 may be caused when a free storage space of the volatile memory device 210 is insufficient to provide the storage space associated with the first command and address CAL The second controller 230 may select a particular storage space of storage spaces mapped to the volatile memory device 210, and may eliminate the selected storage space. For example, the selected storage space may be a dirty storage space that has been previously utilized. The second controller 230 may cause the write operation to the nonvolatile memory device 220 by returning the selected storage space to the nonvolatile memory device 220.

In operation S943, the second controller 230 may transmit a read request R for the selected storage space to the volatile memory device 210. The read request R may be transmitted to the volatile memory device 210 as the second command and address CA2 or the second control signal CTRL2.

For example, the read request R2 may be transmitted to the volatile memory device 210 as the second command and address CA2. In some embodiments, the read request R may be transmitted to the volatile memory device 210 as the second control signal CTRL2. For example, the second controller 230 may activate a particular control signal such as SAVEn.

When the particular control signal is activated, the volatile memory device 210 may output a stored data such as data at a location (e.g., a bank) designated by an internal schedule, and/or all data. The second controller 230 may store data received from the volatile memory device 210.

The volatile memory device 210 may perform the read operation RD in response to the read request R. Data read from the volatile memory device 210 may be transmitted to the second controller 230 in operation S944. As data of the selected storage space is read from the volatile memory device 210, in operation S944, the second controller 230 may transmit the third write request W3 to the nonvolatile memory device 220. The third write request W3 may be transmitted to the nonvolatile memory device 220 as the third command and address CA3 or the third control signal CTRL3.

The nonvolatile memory device 220 may perform the write operation WR in response to the third write request W3. While the nonvolatile memory device 220 performs the write operation WR, the write error signal WRCRC is enabled. Therefore, while the nonvolatile memory device 220 performs the write operation WR, the first controller 130c may repeatedly perform the write retry to transmit the recovery RE and the second write request W2 in operation S946 to operation S950.

In operation S951, the nonvolatile memory device 220 may inform the second controller 230 that the write operation WR is completed. After the write operation WR is completed, in operation S952, the first controller 130a may transmit the second read request R2 to perform the write retry.

After the write operation WR to the nonvolatile memory device 220 is completed, when the second write request W2 is received (operation S952), the second controller 230 may disable the write error signal WRCRC. The second controller 230 may map the storage space associated with the first command and address CA1 to the volatile memory device 210 according to the second write request W2 in operation S952.

In operation S953, the second controller 230 may transmit the third write request W3 to the volatile memory device 210. The third write request W3 may be transmitted to the volatile memory device 210 as the second command and address CA2 or the second control signal CTRL2. The volatile memory device 210 may perform the write operation WR in response to the third write request W3.

Figure 22:
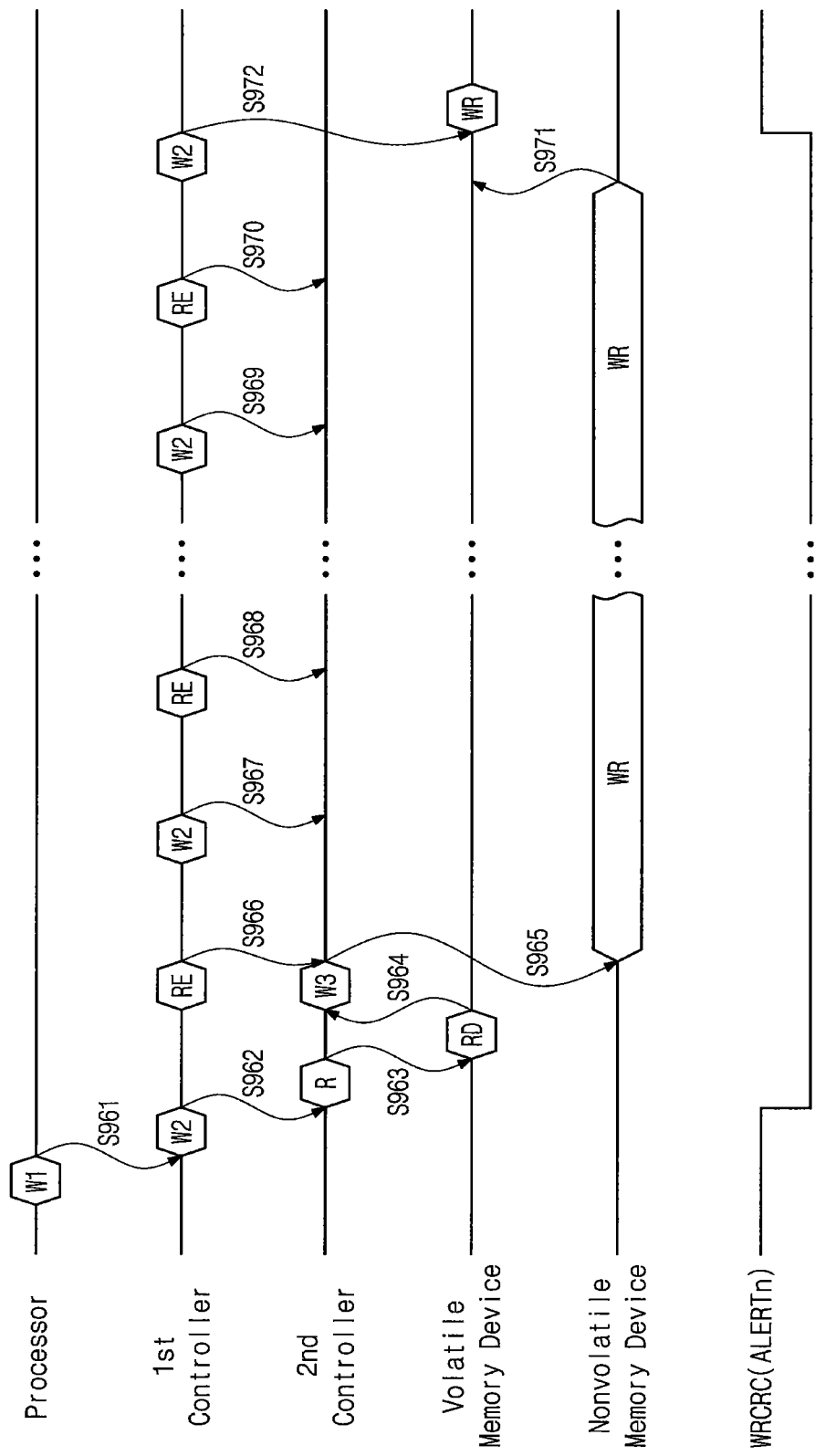
FIG. 22 is an example timing diagram for the write operation illustrated in FIG. 18 according to some embodiments of the present inventive concept.

FIG. 22 is an example for the read operation illustrated in FIG. 21. Referring to FIG. 2, FIG. 16, FIG. 19, and FIG. 22, since operation S961 to operation S971 correspond to operation S941 to operation S951 shown in FIG. 21, detailed description thereof will be omitted.

After the write operation WR is completed in the nonvolatile memory device 220, in operation S972, the first controller 130c may transmit the second write request W2 to the second controller 230. The second controller 230 may transmit the second write request W2 to the volatile memory device 210 as the third write request W3.

Data transmitted from the first controller 130c may be directly transmitted to the volatile memory device 210 through the second controller 230 and the first to eighth data buffers 241 to 248 without being controlled and buffered by the second controller 230. Since LRDIMM is based on the dynamic random access memory (DRAM), the volatile memory device 210 may communicate directly with the first controller 130a.

Figure 23:
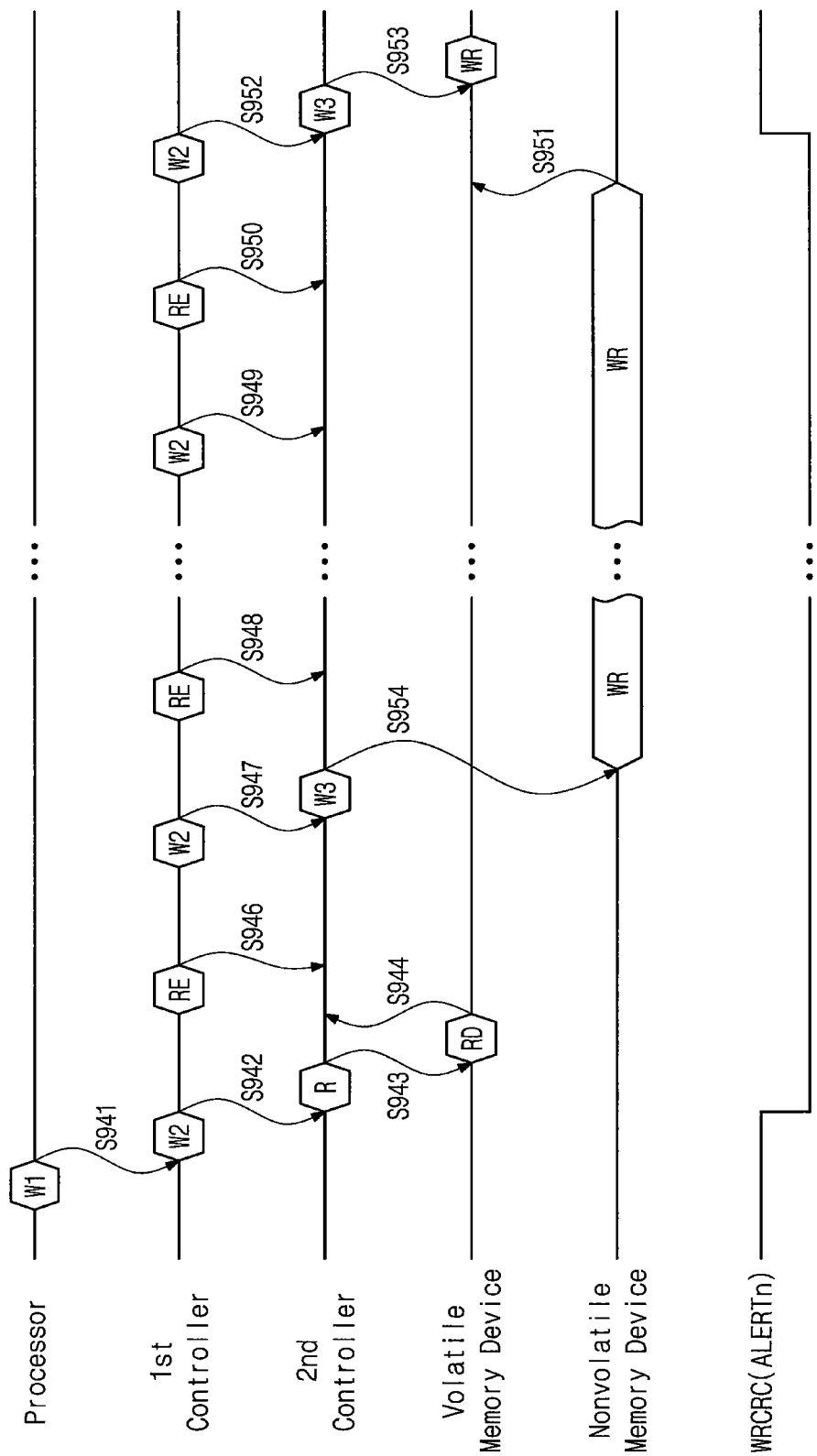
FIG. 23 is an example timing diagram for the write operation illustrated in FIG. 18 according to some embodiments of the present inventive concept.

FIG. 23 is an example for the read operation illustrated in FIG. 21. Referring to FIG. 2, FIG. 16, FIG. 19, and FIG. 23, the second controller 230 may wait without transmitting the third write request W3 to the nonvolatile memory device 220 when the read operation RD is completed. After the read operation RD is completed, in operation S947, the second write request W2 may be transmitted from the first controller 130c. The second controller 230 may transmit the third write request W3 to the nonvolatile memory device 220 in response to the second write request W2 in operation S954.

In some embodiments, in FIG. 13 and FIG. 14, the second controller 230 is described as including the SPD device 141 and the register updater 142. Also, in FIG. 16, the second controller 230 is described as including the write error controller 143. However, it is not limited thereto, the second controller 230 according to an exemplary embodiment of the inventive concept may include the SPD device 141, the register updater 142, and the write error controller 143.

The register updater 142 may update the register 132 of the first controller 130a, 130b, and 130c to perform the read retry without the limitation to the number of times. Additionally, the register updater 142 may update the register 132 of the first controller 130a, 130b, and 130c to perform the write retry without the limitation to the number of times.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory system comprising:
a nonvolatile memory module; and
a first controller configured to control the nonvolatile memory module, the nonvolatile memory module comprising:
a volatile memory device;
a nonvolatile memory device; and
a second controller configured to control the volatile memory device and the nonvolatile memory device,
wherein the first controller is configured to transmit a read request to the second controller,
wherein the second controller is configured to control either the volatile memory device or the nonvolatile memory device to read data from the volatile memory device or the nonvolatile memory device in response to the read request, and
wherein, during reading the data from the volatile memory device or the nonvolatile memory device according to the read request, when normal data is not received from the nonvolatile memory device, the first controller performs one or more retransmits of the read request to the second controller without a limitation on a number of times that the first controller performs the one or more retransmits of the read request.

2. The memory system of claim 1,
wherein the normal data comprises error-free data or correctable data having an error within a correctable range,
wherein when a first time period passes without receiving the normal data after transmitting the read request, the first controller performs a first retransmit of the read request of the one or more retransmits, and wherein when a second time period passes without receiving the normal data after the first retransmit of the read request, the first controller performs a second retransmit of the read request of the one or more retransmits.

3. The memory system of claim 2, wherein the second time period is shorter than the first time period.

4. The memory system of claim 1,
wherein the normal data comprises error-free data or correctable data having an error within a correctable range, and
wherein the second controller reads data comprising the normal data or uncorrectable data from one of the nonvolatile memory device or the volatile memory device in response to receiving the read request.

5. The memory system of claim 4, wherein while the second controller reads the data from the nonvolatile memory device, the second controller ignores the one or more retransmits of the read request.

6. The memory system of claim 5, wherein after the data is read from the nonvolatile memory device, the data that is read is transmitted to the first controller in response to the at least one of the one or more retransmits of the read request.

7. The memory system of claim 1, wherein when a third time period passes without receiving the normal data after performing a first one of the one or more retransmits of the read request, the first controller determines a read fail.

8. The memory system of claim 7,
wherein the normal data comprises error-free data or correctable data having an error within a correctable range, and
wherein the third time period is longer than a time period that the second controller reads data comprising the normal data or uncorrectable data from the nonvolatile memory device.

9. The memory system of claim 1,
wherein the second controller comprises a serial presence detect (SPD) device that indicates to the first controller that the nonvolatile memory module is present.

10. The memory system of claim 9, wherein the second controller is configured to communicate with the first controller through a system management bus (SMBus).

11. The memory system of claim 1,
wherein the first controller transmits a write request to the second controller, and
wherein, during a write operation according to the write request, when the second controller writes write data to the nonvolatile memory device, the second controller activates a write error signal provided to the first controller.

12. The memory system of claim 11,
wherein the second controller performs a writing to one of the volatile memory device or the nonvolatile memory device in response to the write request, and
wherein the second controller deactivates the write error signal when the writing to the nonvolatile memory device according to the write request is completed.

13. The memory system of claim 11, wherein when the write error signal is activated, the first controller retransmits the write request to the second controller.

14. The memory system of claim 11, wherein after the writing of the write data to the nonvolatile memory device is completed, the second controller deactivates the write error signal upon receiving the write request that has been retransmitted.

15. The memory system of claim 14, wherein while the write data is written to the nonvolatile memory device, the second controller ignores the write request that has been retransmitted.

16. A memory module comprising:
a volatile memory device;
a nonvolatile memory device; and
a controller configured to control the volatile memory device and the nonvolatile memory device,
wherein during a write operation, the controller performs a writing to one of the volatile memory device or the nonvolatile memory device in response to a write request, and
wherein while the writing to the nonvolatile memory device is performed, the controller is configured to activate a write error signal output to an external device, the write error signal causing a retransmission of the write request, and configured to update a register of the external device with a value indicating a number of times for read retry.

17. The memory module of claim 16, wherein while the writing to the nonvolatile memory device is performed, the controller ignores the write request that is being retransmitted.

18. The memory module of claim 16,
wherein during a read operation, the controller performs a reading to one of the volatile memory device or the nonvolatile memory device in response to a read request, and
wherein while the reading to the nonvolatile memory device is performed, the controller ignores the read request that is being retransmitted.

19. A method of operating a memory module configured to communicate with an external controller comprising a register, the memory module comprising nonvolatile memories and a controller controlling the nonvolatile memories and volatile memories, the method comprising:
detecting, at the memory module, a power on; and
outputting, by the memory module, a value to the controller through a system management bus (SMBus) to update the register of the external controller, the value indicating a number of times a read retry, to the memory module from the external controller, is performed by the external controller.

* * * * *